(12) United States Patent
Uekusa

(10) Patent No.: US 9,989,590 B2
(45) Date of Patent: Jun. 5, 2018

(54) SELF-TEST CIRCUIT IN INTEGRATED CIRCUIT, AND DATA PROCESSING CIRCUIT

(71) Applicant: Shigeru Uekusa, Kanagawa (JP)

(72) Inventor: Shigeru Uekusa, Kanagawa (JP)

(73) Assignee: RICOH COMPANY, LTD., Tokyo (JP)

(*) Notice: Subject to any disclaimer, the term of this patent is extended or adjusted under 35 U.S.C. 154(b) by 28 days.

(21) Appl. No.: 15/188,288

(22) Filed: Jun. 21, 2016

(65) Prior Publication Data

US 2017/0003344 A1    Jan. 5, 2017

(30) Foreign Application Priority Data

Jul. 2, 2015   (JP) ................. 2015-133726

(51) Int. Cl.
*G01R 31/317*   (2006.01)
*G01R 31/3187*   (2006.01)

(52) U.S. Cl.
CPC . *G01R 31/31727* (2013.01); *G01R 31/31723* (2013.01); *G01R 31/3187* (2013.01)

(58) Field of Classification Search
CPC ............. G01R 31/307; G01R 31/317; G01R 31/2843; G01R 31/31707; G01R 31/31724; G01R 31/31723
See application file for complete search history.

(56) References Cited

U.S. PATENT DOCUMENTS 6,865,222 B1 *   3/2005   Payne ............... H04B 3/46
                                              375/224
7,644,333 B2 *   1/2010   Hill ............ G01R 31/318547
                                              714/726

FOREIGN PATENT DOCUMENTS

JP    2004-325124    11/2004
JP    2015-046749    3/2015

* cited by examiner

*Primary Examiner* — Shelly A Chase
(74) *Attorney, Agent, or Firm* — Cooper & Dunham LLP

(57) ABSTRACT

A self-test circuit is driven by a multiphase clock signal which includes N number of clock signals in same cycle having phases from first to N-th phases each phase-shifted by 1/N of the cycle. The self-test circuit includes a data selecting circuit, a serialization circuit, and a logical test circuit. The data selecting circuit switches input data that are input as M-bit wide parallel data to the self-test circuit, between normal data and test data for logical test. The serialization circuit performs serial conversion of the input data in N-parallel manner and outputs bits in N-parallel manner, as a single serial output signal at timing corresponding to each phase. In synchronization with timing corresponding to each phase, the logical test circuit imports the serial output signal as N-parallel bit strings each having length equal to M/N number of bits and performs a bit logical test for M number of bits.

8 Claims, 11 Drawing Sheets

*prior art*

SELF-TEST CIRCUIT IN INTEGRATED CIRCUIT, AND DATA PROCESSING CIRCUIT

CROSS-REFERENCE TO RELATED APPLICATIONS

The present application claims priority under 35 U.S.C. § 119 to Japanese Patent Application No. 2015-133726 filed on Jul. 2, 2015. The contents of which are incorporated herein by reference in their entirety.

BACKGROUND OF THE INVENTION

1. Field of the Invention

The present invention relates to a self-test circuit in an integrated circuit, and a data processing circuit.

2. Description of the Related Art

An optical scanning device is known that performs deflection scanning of optical beams, and an optical writing device is known that is related to electrophotographic image formation and that forms an image by performing image writing on the surface of a photoconductor using the optical beams subjected to deflection scanning by the optical scanning device. Such an optical writing device that is related to electrophotographic image formation is installed in, for example, a copying machine, a facsimile device, a printer, a printing machine, or a digital multifunction peripheral (MFP). In an optical writing device that is related to electrophotographic image formation, a technology is known in which optical sensors are arranged before and after the image area in a main scanning direction, and in which pulse-width modulation (PWM) data is used for the purpose of correcting the variation in the main scanning direction magnification, which is attributed to a rise in temperature, according to the duration of light detection by the optical sensors.

In a digital circuit including a large number of flip-flops (hereinafter, abbreviated as FFs), such as in a circuit in which the PWM technology is implemented; in the case of attempting a test for detecting defects in the FFs, the following issue arises. That is, if it is to be verified whether the target digital circuit for testing has been able to perform timing adjustment at the highest clock speed; then, at the time of performing a scan test during the operations in a scan operation mode of the digital circuit, it becomes necessary to perform the test at the highest clock speed of the chip.

However, in order to perform a test at the highest clock speed, in the clock line of the digital circuit performing high-speed operations, if a clock or a selector is additionally installed as a requirement for switching from the normal operation mode to the scan test, the following issue arises. That is, as a result of adding a clock or a selector required for switching to the scan test, even if an attempt is made to appropriately achieve a synchronous design of the digital circuit, timing adjustment of the entire circuit becomes a difficult task.

In that regard, for example, in the conventional technology disclosed in Japanese Unexamined Patent Application Publication No. 2004-325124, the following method is implemented in order to detect defects in the FFs. A frequency counter, which is used to monitor the operating frequency of the target circuit for testing via an external terminal of the chip, is installed in a semiconductor test device; and the detection of defects is done by lowering the operating frequency. For example, Japanese Unexamined Patent Application Publication No. 2004-325124 discloses a technology in which the semiconductor circuit that is designed to have synchronization according to clock signals is made to read test data representing a bit string for circuit operation test, and defects in the FFs in the semiconductor circuit are detected.

More particularly, Japanese Unexamined Patent Application Publication No. 2004-325124 discloses an invention in which, while maintaining the current logical state of the FFs, the operation mode of the semiconductor circuit is switched from the normal operation mode to the scan mode; and then the logical state of the FFs that are made to read the test data is checked. In Japanese Unexamined Patent Application Publication No. 2004-325124, the logical state of "1" or "0" stored in each FF, which has read the test data, is compared with a known bit in the test data; and the FFs in which the stored logical state is different than the known bit are determined to be defective.

However, if the method disclosed in Japanese Unexamined Patent Application Publication No. 2004-325124 is implemented, in the synchronous design of the target digital circuit for testing, even if an attempt is made to verify whether timing adjustment was correctly performed during the operations at the highest clock speed, there is a disadvantage as follows. That is, at the time of performing a scan test during a scan operation mode of the digital circuit, it is not possible to perform a test at the highest clock speed of the chip in which the digital circuit is mounted, thereby making the test ambiguous.

SUMMARY OF THE INVENTION

According to one aspect of the present invention, a self-test circuit in an integrated circuit is driven by a multiphase clock signal which includes N number of clock signals in same cycle having phases from a first phase to an N-th phase that are each phase-shifted by 1/N of the cycle. The self-test circuit includes a data selecting circuit, a serialization circuit, and a logical test circuit. The data selecting circuit switches input data between normal data and test data for logical test. The input data is input as M-bit wide parallel data to the self-test circuit; and a logical test circuit. The serialization circuit performs serial conversion of the input data in N-parallel manner and outputs bits in N-parallel manner, as a single serial output signal at timing corresponding to each phase from the first phase to the N-th phase. In synchronization with timing corresponding to each phase from the first phase to the N-th phase, the logical test circuit imports the serial output signal as N-parallel bit strings each having length equal to N/N number of bits and performs a bit logical test for M number of bits.

BRIEF DESCRIPTION OF THE DRAWINGS

The accompanying drawings are intended to depict exemplary embodiments of the present invention and should not be interpreted to limit the scope thereof. Identical or similar reference numerals designate identical or similar components throughout the various drawings.

DETAILED DESCRIPTION OF THE PREFERRED EMBODIMENTS

Figure 1:
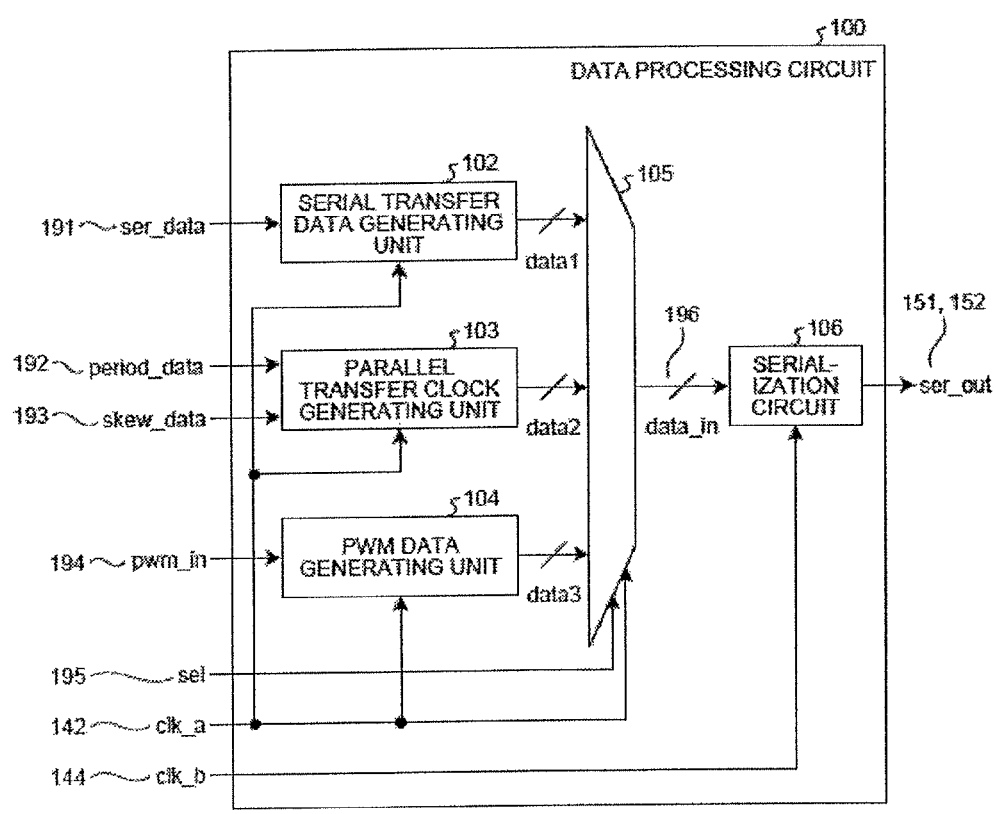
FIG. 1 is a block diagram illustrating an overall circuit configuration of a data processing circuit according to a conventional technology.

The terminology used herein is for the purpose of describing particular embodiments only and is not intended to be limiting of the present invention.

As used herein, the singular forms "a", "an" and "the" are intended to include the plural forms as well, unless the context clearly indicates otherwise.

In describing preferred embodiments illustrated in the drawings, specific terminology may be employed for the sake of clarity. However, the disclosure of this patent specification is not intended to be limited to the specific terminology so selected, and it is to be understood that each specific element includes all technical equivalents that have the same function, operate in a similar manner, and achieve a similar result.

An embodiment of the present invention will be described in detail below with reference to the drawings.

An object of an embodiment is to obtain a self-test circuit that is capable of detecting the defects in each FF in an integrated circuit having the self-test function, without having to switch the integrated circuit to a test operation mode, without having to lower the clock speed for driving the integrated circuit from the highest speed, and while maintaining a high defect detection rate.

An optical scanning device is known that performs deflection scanning of optical beams, and an optical writing device is known that is related to electrophotographic image formation and that forms an image by performing image writing on the surface of a photoconductor using the optical beams subjected to deflection scanning by the optical scanning device. Such an optical writing device that is related to electrophotographic image formation is installed in, for example, a copying machine, a facsimile device, a printer, a printing machine, or a digital multifunction peripheral (MFP). In an optical writing device that is related to electrophotographic image formation, a technology is known in which optical sensors are mounted before and after the image area in the main scanning direction, and in which pulse-width modulation (PWM) data is used for the purpose of correcting the variation in the main scanning direction magnification, which is attributed to a rise in temperature, according to the duration of light detection by the optical sensors.

In order to implement an optical writing device related to electrophotographic image formation, it becomes necessary to have a circuit equipped with the PWM technology for the purpose of generating PWM data. In Japanese Unexamined Patent Application Publication No. 2015-046749, a circuit configuration of a data processing circuit is disclosed that enables implementation of a circuit equipped with the PWM technology using a single circuit module and according to various application usages. In Japanese Unexamined Patent Application Publication No. 2015-046749, as an example of a data processing circuit in which the PWM technology is implemented, a circuit configuration is disclosed that converts input parallel data into serial signals, and outputs the serial signals. The circuit disclosed in Japanese Unexamined Patent Application Publication No. 2015-046749 can process data using a single circuit module and according to various application usages. As a data processing circuit in which the PWM technology is implemented, a circuit configuration identical to the circuit configuration disclosed in Japanese Unexamined Patent Application Publication No. 2015-046749 is illustrated in FIG. 1.

A data processing circuit 100 illustrated in FIG. 1 includes, for example, a 1-chip integrated circuit (IC or LSI) and includes a serial transfer data generating unit 102, a parallel transfer clock generating unit 103, a PWM data generating unit 104, a selector 105, and a serialization circuit 106. Herein, parallel data data1 output by the serial transfer data generating unit 102, parallel data data2 output by the parallel transfer clock generating unit 103, and parallel data data3 output by the PWM data generating unit 104 is output to the serialization circuit 106 serving as the common output destination. From among the parallel data output by the serial transfer data generating unit 102, the parallel transfer clock generating unit 103, and the PWM data generating unit 104; the parallel data to be output to the serialization circuit 106 is selected by the selector 105. Regarding each piece of parallel data input to the serialization circuit 106, the selection is decided using a selection signal sel 195 that is applied to the selector 105.

To the serial transfer data generating unit 102, predetermined serialization data (parallel data representing serial transfer data) ser_data 191 is input. Then, the serial transfer data generating unit 102 performs encoding of the serialization data ser_data 191 and outputs, to the selector 105, the result as the predetermined parallel data data1 for serial transfer. To the parallel transfer clock generating unit 103, oscillation period setting value data (a clock period setting value) period_data 192 and skew adjustment value data skew_data 193 is input. Based on such input data, the parallel transfer clock generating unit 103 generates a clock for parallel transfer and outputs it to the selector 105. To the PWM data generating unit 104, a duty setting input signal pwm_in 194 for PWM data is input. According to the input signal pwm_in 194, the PWM data generating unit 104 performs pulse width modulation with respect to predetermined carrier wave pulse signals, and outputs the post-pulse-width-modulation parallel data data3 to the selector 105. Then, based on the selection signal sel, the selector 105 selects a single piece of data from among the pieces of parallel data data1 to data3, and outputs the selected data to the serialization circuit 106. Herein, the pieces of data data1 to data3 and the data data_in have the same predetermined bit wide.

The serialization circuit 106 performs serial conversion of the parallel data data_in into a serial output signal ser_out 151. Herein, only the serial output signal set out 151 is synchronous with a clock signal clk_b, and all other data_in the data processing circuit is synchronous with a clock signal clk_a. Herein, the clock signal clk_a represents a frequency-division signal of the clock signal clk_b, and the frequency division ratio is equal to the bit wide of the data data_in. In the data processing circuit 100 configured in the manner described above, various types of end-usage such as the serial communication method, the parallel communication method, and the PWM method can be implemented using a single chip or a single module. That enables achieving reduction in the circuit scale, the design cost, and the area cost. On the other hand, the circuit configuration disclosed in Japanese Unexamined Patent Application Publication No. 2015-046749 is identical to the circuit configuration disclosed in Japanese Unexamined Patent Application Publication No. 2004-325124 in the way that a circuit operation test cannot be performed at the highest clock speed of the chip in which the digital circuit is mounted.

As is the case in the circuit configuration disclosed in Japanese Unexamined Patent Application Publication No. 2015-046749, a circuit equipped with the PWM technology is implemented as a digital circuit including a large number of FFs. In that digital circuit, when a test is attempted for detecting defects in the FFs, in order to verify whether the digital circuit is able to perform timing adjustment at the highest clock speed, it becomes necessary to perform the test at the highest clock speed of the semiconductor chip in which the digital circuit is mounted. However, in order to perform a circuit test at the highest clock speed, even if the circuit test function disclosed in Japanese Unexamined Patent Application Publication No. 2004-325124 is incorporated in the PWM-technology-equipped circuit disclosed in Japanese Unexamined Patent Application Publication No. 2015-046749, in the synchronization design in the circuit that is driven by clock signals of the highest speed, any margin the timing adjustment range disappears. The disappearance of the margin the synchronization timing design of the circuit during the driving at the highest clock speed occurs because it becomes difficult to route the layout of the circuit in such a way that data communication between the FFs becomes more possible as the clock period becomes faster. In that regard, it is an object of embodiments to not only implement a self-test circuit, which is equipped with the function enabling a logical test of each circuit-constituting FF during the operations of the circuit, in the PWM-technology-equipped circuit such as the data processing circuit 100 disclosed in Japanese Unexamined Patent Application Publication No. 2015-046749; but also to implement the following.

Firstly, it is an object of the embodiments to perform, in a self-test circuit device, a defect detection test by performing logical tracing of each FF in the target circuit device for testing without having to switch the operation mode from the normal operation mode to the scan mode as is the case in Japanese Unexamined Patent Application Publication No. 2004-325124. Secondly, it is an object of the embodiments to perform, in a self-test circuit device, a defect detection test by performing logical tracing of each FF in the target circuit device for testing without having to lower the clock operation speed from the highest clock speed and while maintaining a high defect detection rate. Thirdly, it is an object of the embodiments to provide a sufficiently large margin the timing adjustment of the synchronization design of the entire self-test circuit and to ensure an accurate and reliable clock control operation of the entire self-test circuit.

In the following explanation of the present written description, a logical test points to a function or a mechanism for performing the following test in the target circuit for testing. That is, when the target circuit for testing, in which the internal state of the circuit undergoes a transition for each clock pulse in synchronization with clock signals, is configured by connecting a large number of FFs in series or in parallel; it is examined whether the logical state ("0" or "1") stored in each FF for each clock pulse matches with the original correct value. Moreover, a self-test circuit points to the target circuit for testing with a built-in wired logic or a built-in circuit module representing a mechanism for implementing the logical test. The logical test performed by the self-test circuit is called a self-test. In the following explanation of the present written description, a series circuit which is configured by connecting, in series, a large number of FFs constituting the circuit and in which the internal state undergoes a transition for each clock pulse in synchronization with clock signals is called an FF chain.

In order to change the circuit structure of the data processing circuit 100 illustrated in FIG. 1, and to implement a self-test mechanism in such a way that the logical state of all FFs is reliably examinable without any omission; the self-test function can be implemented in the most compact circuit scale according to the method described below. That is, according to the embodiments, a new self-test circuit is implemented that not only has the mechanism of implementing the self-test (logical test) function but also has a serialization circuit function equivalent to the serialization circuit 106 illustrated in FIG. 1. Then, in the data processing circuit 100, the serialization circuit 106 is replaced with the new self-test circuit mentioned above. As a result, it becomes possible to implement a self-test mechanism, which enables reliable examination of the logical state of all FFs without any omission, using a circuit having the smallest scale. That is because, with reference to FIG. 1, the serialization circuit 106 is a circuit that is positioned at the last stage in the data processing circuit 100 and that outputs only the final output signal ser_out 151 by performing serialization of the parallel data that is output from the prior-stage circuits 102, 103, and 104 via the selector 105.

First Embodiment

Figure 2:
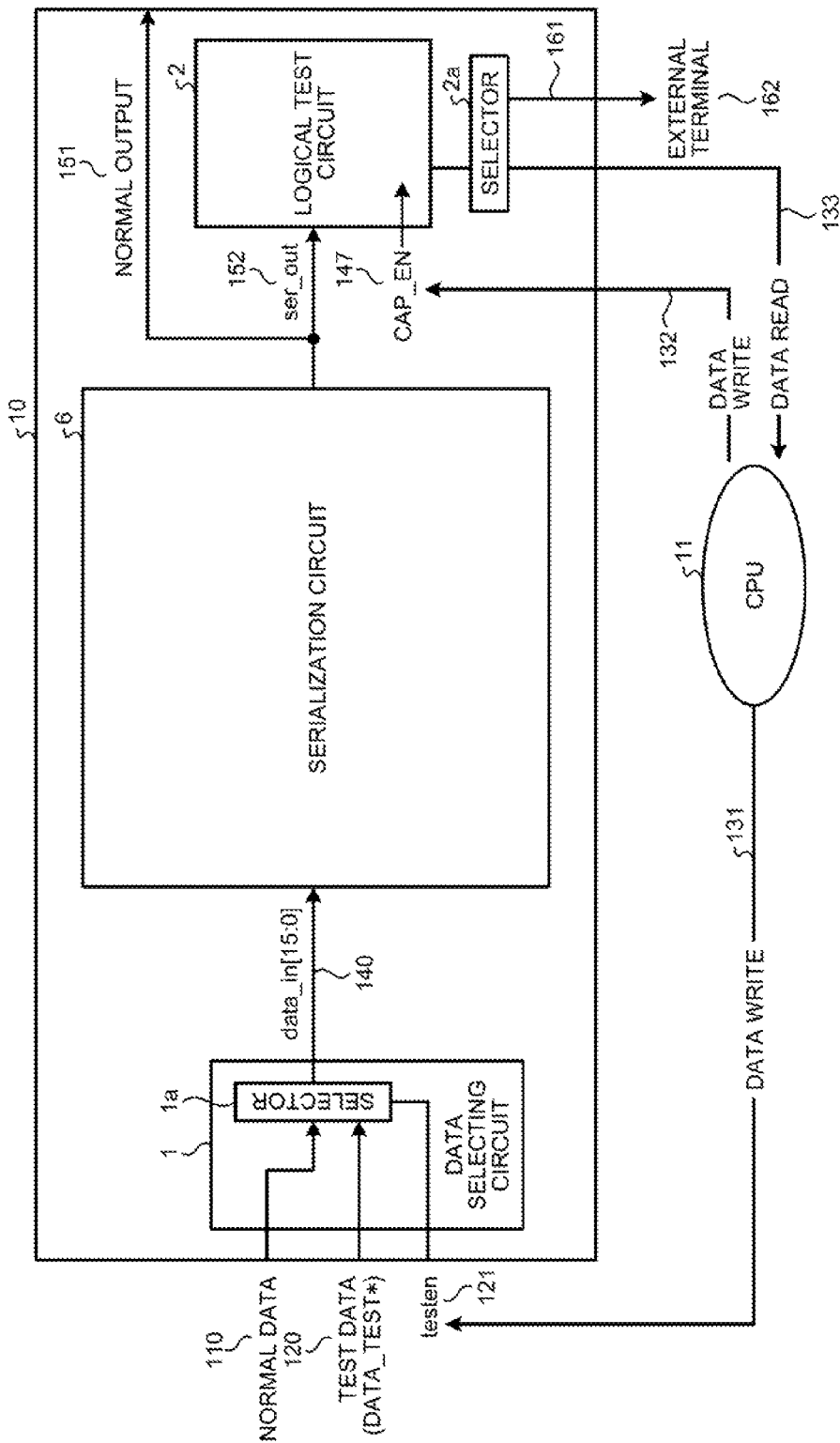
FIG. 2 is a block diagram illustrating an overall circuit configuration of a self-test circuit according to an embodiment.

In FIG. 2 is illustrated an overall circuit configuration of a new self-test circuit 10 that not only has the self-test function but is also configured to have the serialization circuit function equivalent to the serialization circuit 106 illustrated in FIG. 1. Although described later, during normal operations of the data processing circuit 100 illustrated in FIG. 1, the parallel data to be subjected to serialization is input as normal data 110 to the self-test circuit 10. During a logical test performed in the data processing circuit 100 illustrated in FIG. 1, the parallel data to be subjected to serialization is input as test data (DATA_TEST*) 120 to the self-test circuit 10. Herein, the normal data 10 and the test data (DATA_TEST*) 120 is generated, for example, by the circuits 102, 103, and 104 illustrated in FIG. 1, and represents parallel data output to the self-test circuit 10 via the selector 105 illustrated in FIG. 1.

The self-test circuit 10 includes a data selecting circuit 1, a serialization circuit 6, a logical test circuit 2, and a selector 2a. The data selecting circuit 1 selects, as input data to be input to the serialization circuit 6, either the normal data 110 or the test data (DATA_TEST*) 120 according to whether the data processing circuit 100 is performing normal operations or performing a logical test. In the data selecting circuit 1, during a logical test performed by the data processing circuit 100; a testen (test enable) signal 121 that is input to a selector 1a is in the ON state, and thus the selector 1a selects the test data (DATA_TEST*) 120 as the input data. During the normal operations of the data processing circuit 100; the testen signal 121 that is input to the selector 1a is in the OFF state, and thus the selector 1a selects the normal data 110 as the input data. When either the testen signal 121, or the normal data 110, or the test data (DATA_TEST*) 120 are to be output to the data selecting circuit 1; an external central processing unit (CPU) 11 outputs a data write signal 131 to the self-test circuit 10.

The serialization circuit 6 receives, from the data selecting circuit 1, either the normal data 110 or the test data (DATA_TEST*) 120 as input data (data_in[15:0]) 140 representing 16-bit wide parallel data. The serialization circuit 6 converts the received input data 140 into a serial signal by means of serialization, and outputs the serial signal as a normal output 151 to the outside of the self-test circuit 10 as well as outputs the serial signal as a serial output signal (ser_out) 152 to the logical test circuit 2. The serialization performed by the serialization circuit 6 illustrated in FIG. 2 is functionally equivalent to the serialization performed by the serialization circuit 106 illustrated in FIG. 1. However, as described later, the internal circuit structure of the serialization circuit 6 illustrated in FIG. 2 differs in a major way from the circuit structure of the serialization circuit 106 illustrated in FIG. 1.

Inside the logical test circuit 2, an FF chain for logical test is disposed. The logical test circuit 2 reads, into the FF chain for logical test, a bit string output as the serial output signal (ser_out) 152 from the serialization circuit 6. Herein, the serial output signal (ser_out) 152 that is read by the logical test circuit 2 is obtained by converting the parallel data, which is input as the test data 120 to the data selecting circuit 1 during the logical test performed by the data processing circuit 100, into a serial signal by the serialization circuit 6.

The operation of reading the serial output signal (ser_out) 152 into the FF chain for logical test is started when a capture enable (CAP_EN) signal, which is output by the external CPU 11 to the logical test circuit 2, is switched to the ON state. Once the capture enable (CAP_EN) signal is switched to the ON state; the logical test circuit 2 reads, in synchronization with each pulse of the clock signal, one bit at a time from the bit string included in the serial output signal (ser_out) 152 into the FF chain for logical test. On the other hand, the operation of reading the serial output signal (ser_out) 152 into the FF chain for logical test is stopped when the capture enable (CAP_EN) signal, which is output by the external CPU 11 to the logical test circuit 2, is switched to the OFF state. For the external CPU 11 to output the capture enable (CAP_EN) signal to the logical test circuit 2, the CPU 11 outputs a data write signal 132 to the logical test circuit 2.

For one piece of parallel data subjected to serialization, the logical test circuit 2 reads the serial output signal (ser_out) 152 having the length of 16 bits into the FF chain for logical test. Then, in the state in which the FF chain for logical test has read the 1-bit long serial output signal (ser_out) 152, the logical test circuit 2 compares the logical state ("0" or "1") stored in each FF in the FF chain with a known bit pattern. As a result of the comparison; if, in the FF chain for logical test, the logical state stored in one or more FFs is different than the known bit value included in the corresponding bit positions in the test data 120, the logical test circuit 2 determines that some of the FFs in the data processing circuit 100 have defects. The data representing the result of the logical test performed by the logical test circuit 2 is output as a data read signal 133 to the CPU 11 via the selector 2a. Then, the CPU 11 displays data representing the result of the logical test on a screen or stores that data in a memory (not illustrated). Alternatively, the data representing the result of the logical test performed by the logical test circuit 2 is output as an external output 161 to an external terminal 162 of the data processing circuit 100. Herein, the selector 2a is a selecting circuit for selecting whether the data representing the result of the logical test is to be output by the CPU 11 as a data read signal or whether the data representing the result of the logical test is to be output as an external output to the external terminal 162.

Figure 3:
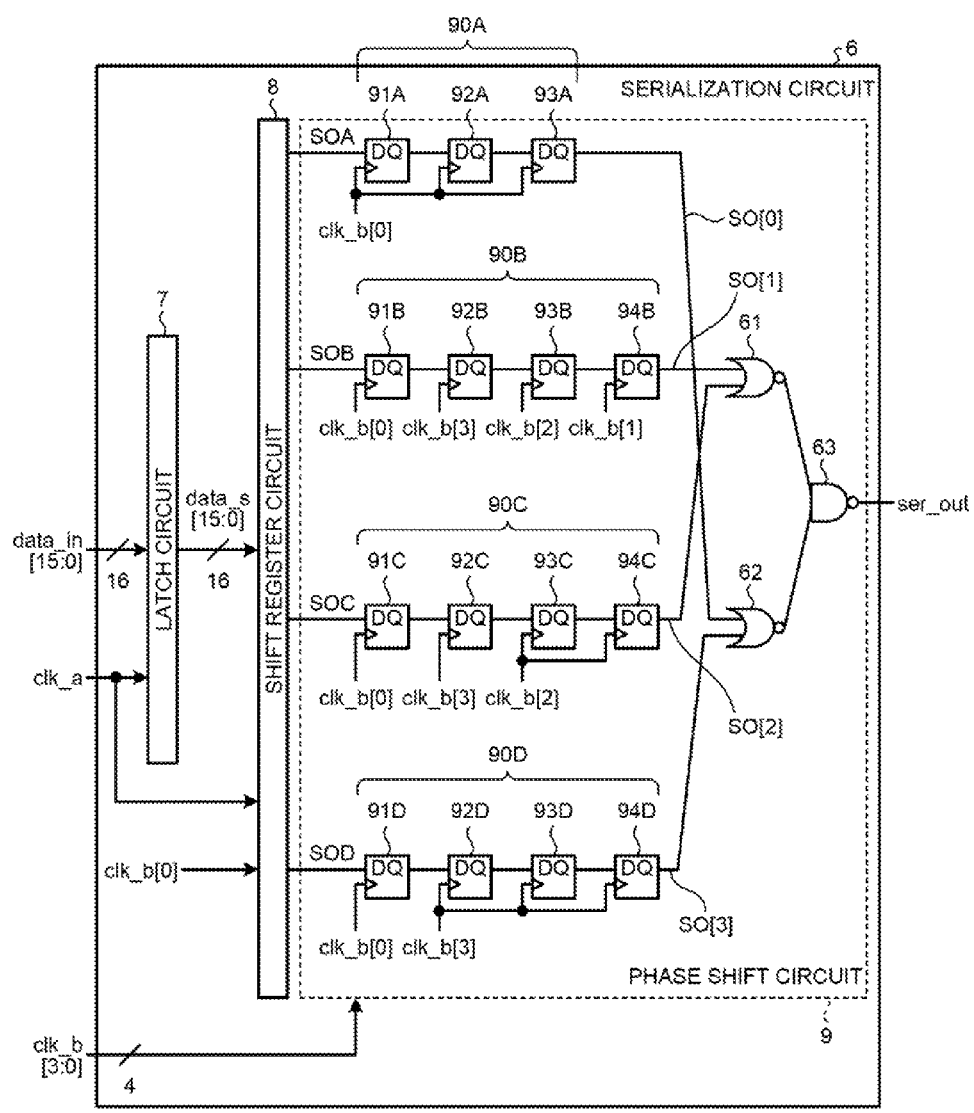
FIG. 3 is a block diagram illustrating an internal circuit structure of a serialization circuit according to the embodiment.

FIG. 3 is a block diagram of a detailed circuit configuration of the serialization circuit 6. As illustrated in FIG. 2 the serialization circuit 6 is driven using two types of clock signals, namely, clk_a 142 and clk_b 144. Herein, the clk_b 144 is a multiphase clock signal made of four clock signals having the phases each shifted by 90° in the same cycle. The four clock signals corresponding to the phases of (0°, 90°, 180°, and 270° are written as clk_b[0], clk_b[1], clk_b[2], and clk_b[3], respectively. That is, clk_b[0] to clk_b[3] represent four phase clocks generated by dividing the single-cycle length of the clock signal clk_b into four equal phases (four phases shifted by 90° each) and then performing phase shift of a quarter of the cycle with respect to the four clock signals clk_b having the same cycle. The four clock signals clk_b[0], clk_b[1], clk_b[2], and clk_b[3] are collectively referred to as clk_b[3:0]. Moreover, the clock speed of the clock signal clk_b[0] corresponding to a quarter of the cycle is four times the clock speed of the clock signal clk_b[0] and is equal to the highest clock speed of the data processing circuit 100. On the other hand, the clock signal clk_a is a frequency-division signal of the clock signal clk_b, and the frequency division ratio is equal to the 16-bit wide that is the bit wide of the input data (data_in[15:0]) 140.

With reference to FIG. 3, the serialization circuit 6 includes a latch circuit 7, a shift register circuit 8, and a phase shift circuit 9. To the latch circuit 7, the input data (data_in[15:0]) 140 representing 16-bit wide parallel data is input. Then, the latch circuit 7 latches (holds) the input data 140 over a predetermined period of time in synchronization with the clock clk_a 142. The signal output from the latch circuit 7 to the shift register circuit 8 represents input data (data_s[15:0]) that is 16-bit wide parallel data. The output of the shift register circuit 8 is processed by the phase shift circuit 9, and the result is eventually output as the serial output signal (ser_out) 152 to the logical test circuit 2.

Figure 4:
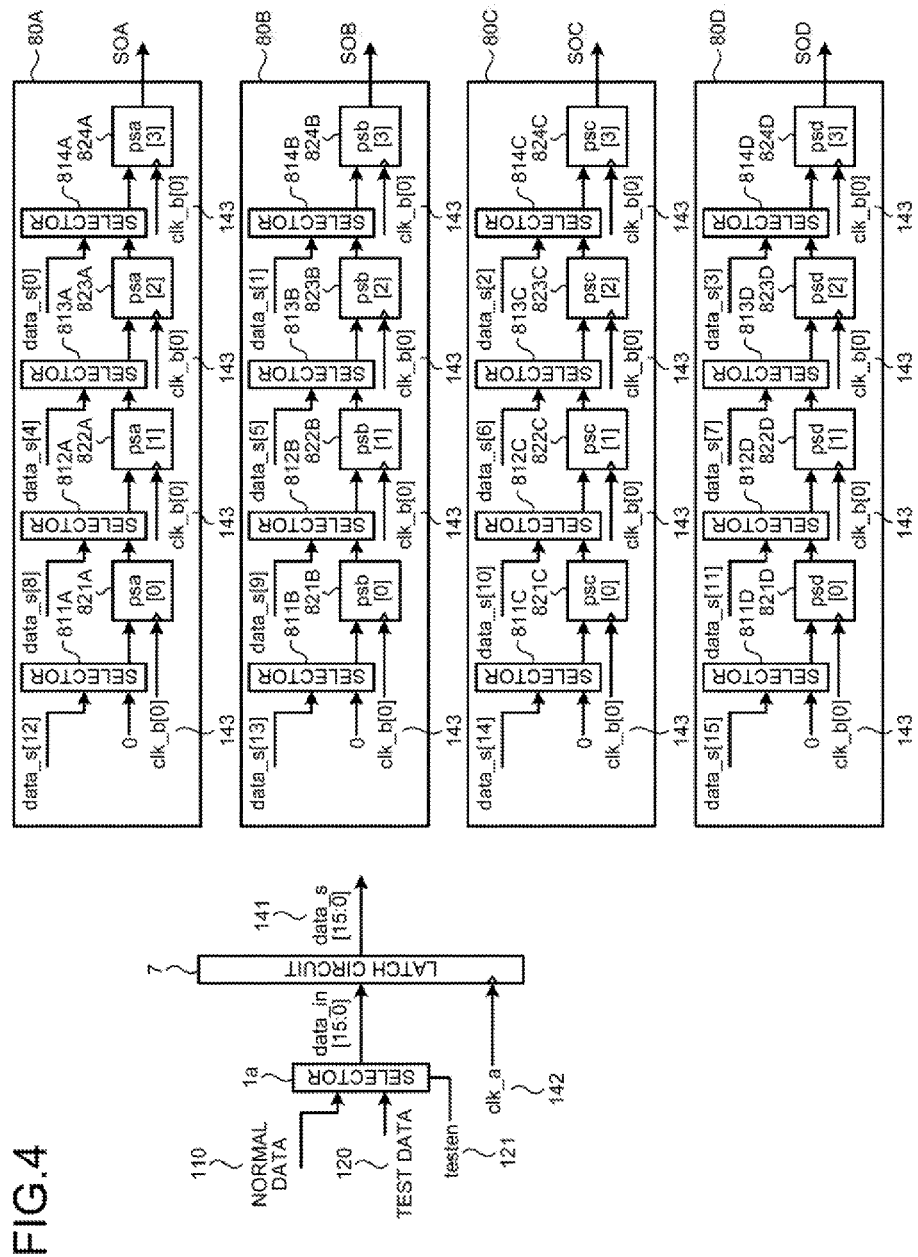
FIG. 4 is a block diagram illustrating data that is input to a shift register circuit from outside and illustrating an internal circuit structure of the shift register circuit.

With reference to FIG. 4, given below is the specific explanation about an internal configuration of the shift register circuit 8, about serialization of the 16-bit wide parallel data in the shift register circuit 8, and about a flow of data signals. The latch circuit 7 can receive, via the selector 1a, either the normal data 110 or the test data 120. During a logical test, since the testen signal 121 output to the selector 1a is in the ON state, the latch circuit 7 receives the test data 120 from outside via the selector 1a. Then, the latch circuit 7 latches (holds) the test data 120, which is received from outside via the selector 1a, over a given period of time and then outputs the test data 120 as an input signal data_s[15:0] 141 to the shift register circuit 8. As illustrated in FIG. 4, the shift register circuit 8 is a shift register circuit having a four-parallel configuration made of four shift registers 80A, 80B, 80C, and 80D operating in parallel. Thus, of the input data (data_s[15:0]) 141 that represents 16-bit wide parallel data received from the latch circuit 7, the shift register circuit 8 allocates four bits to each of the four shift registers 80A to 80D. Then, the shift register circuit 8 performs four parallel operations of converting the input data 141, which is divided into 4-bit pieces and allocated to the four shift registers 80A to 80D, into serial signals.

Each of the four shift registers 80A to 80D is configured as a shift register having a four-stage configuration in which four FFs driven by the common clock signal clk_b[0] are connected in series. For example, the shift register 80A is configured by connecting four FFs 821A, 822A, 823A, and 824A in series as illustrated in FIG. 4. In synchronization with each pulse of the clock signal clk_b[0], either a 0-value bit is input to the FF 821A or the 12-th bit (data_s[12]) of the input data (data_s[15:0]) is input from outside of the shift register circuit 8 to the FF 821A. The selection of the bit data to be input to the FF 821A is done by a selector 811A.

Moreover, in synchronization with each pulse of the clock signal clk_b[0], either the bit data stored in the previous-stage FF 821A is input to the FF 822A or the eighth bit (data_s[8]) of the input data (data_s[15:0]) 141 is input from outside of the shift register circuit 8 to the FF 822A. The selection of the bit data to be input to the FF 822A is done by a selector 812A. In an identical manner, in synchronization with each pulse of the clock signal clk_b[0], either the bit data stored in the previous-stage FF 822A is input to the FF 823A or the fourth bit (data_s[4]) of the input data (data_s[15:0]) 141 is input from outside of the shift register circuit 8 to the FF 823A. The selection of the bit data to be input to the FF 823A is done by a selector 813A. In an identical manner, in synchronization with each pulse of the clock signal clk_b[0], either the bit data stored in the previous-stage FF 823A is input to the FF 824A or the zeroth bit (data_s[0]) of the input data (data_s[15:0]) 141 is input from outside of the shift register circuit 8 to the FF 824A. The selection of the bit data to be input to the FF 824A is done by a selector 814A.

Thus, the selectors 811A, 812A, 813A, and 814A determine, according to the data latching timing of the latch circuit 7, whether to perform MSB output of the parallel input data (data_s[15:0]) 141 from SOA, SOB, SOC, and SOD, respectively, or whether to newly import the parallel input data (data_s[15:0]) 141. Regarding the selection performed by the selectors 811A, 812A, 813A, and 814A; specific explanation is given later with reference to FIG. 7.

In the shift register 80A, in synchronization with the initial pulse of the clock signal clk_b[0], the FFs from the first stage to the fourth stage receive the 12-th bit, the eighth bit, the fourth bit, and the zeroth bit, respectively, of the input data (data_s[15:0]) 141 from outside. Then, in synchronization with the second pulse onward of the clock signal clk_b[0], each FF from the second stage to the fourth stage receives the bit data output by the previous-stage FF (the FFs from the first stage to the third stage) via the selectors 812A to 814A, respectively. As a result, from among the bits constituting the input data (data_s[15:0]) that represents 16-bit wide parallel data; the 12-th bit, the eighth bit, the fourth bit, and the zeroth bit are sequentially shifted one bit at a time in the shift register 80A and are output one bit at a time from the output terminal of the FF 824A in order of the 12-th bit, the eighth bit, the fourth bit, and the zeroth bit.

Regarding the shift registers 80B, 80C, and 80D too, the internal configuration is identical to the internal configuration of the shift register BOA as described above; as well as the point that the four FFs from the first stage to the fourth stage are driven in synchronization with each pulse of the common clock signal clk_b[0] is also identical to the shift register 80A. However, unlike in the shift register 80A, in the shift register 80B, in synchronization with the initial pulse of the clock signal clk_b[0], the FFs from the first stage to the fourth stage receive the 13-th bit, the ninth bit, the fifth bit, and the first bit, respectively, of the input data (data_s[15:0]) 141 from outside. As a result, from among the bits constituting the input data (data_s[15:0]) that represents 16-bit wide parallel data; the 13-th bit, the ninth bit, the fifth bit, and the first bit are sequentially shifted one bit at a time in the shift register 80B and are output one bit at a time from the output terminal of an FF 824B in order of the 13-th bit, the ninth bit, the fifth bit, and the first bit.

Moreover, unlike in the shift register 80A, in the shift register 80C, in synchronization with the initial pulse of the clock signal clk_b[0], the FFs from the first stage to the fourth stage receive the 14-th bit, the 10-th bit, the sixth bit, and the second bit, respectively, of the input data (data_s [15:0]) 141 from outside. As a result, from among the bits constituting the input data (data_s[15:0]) that represents 16-bit wide parallel data; the 14-th bit, the 10-th bit, the sixth bit, and the second bit are sequentially shifted one bit at a time in the shift register 80C and are output one bit at a time from the output terminal of an FF 824C in order of the 14-th bit, the 10-th bit, the sixth bit, and the second bit. Furthermore, unlike in the shift register 80A, in the shift register 80D, in synchronization with the initial pulse of the clock signal clk_b[0], the FFs from the first stage to the fourth stage receive the 15-th bit, the 14-th bit, the seventh bit, and the third bit, respectively, of the input data (data_s[15:0]) 141 from outside. As a result, from among the bits constituting the input data (data_s[15:0]) that represents 16-bit wide parallel data; the 15-th bit, the 11-th bit, the seventh bit, and the third bit are sequentially shifted one bit at a time in the shift register 80D and are output one bit at a time from the output terminal of an FF 524D in order of the 15-th bit, the 11-th bit, the seventh bit, and the third bit.

The input data (data_s[15:0]), which is divided into 4-bit pieces and allocated to the four shift registers SOA, 80B, 80C, and 80D constituting the shift register circuit 8, is subjected to serial conversion according to four parallel operations and converted into four serial output signals SOA, SOB, SOC, and SOD; and the serial output signals are serially output to the phase shift circuit 9 illustrated in FIG. 3 in a four-parallel manner. Reverting to the explanation with reference to FIG. 3, the phase shift circuit 9 includes four delay circuits 90A, 90B, 90C, and 90D; two NOR circuits 61 and 62; and a NAND circuit 63.

The phase shift circuit 9 is subjected to clock control using the four phase clocks clk_b[0] to clk_b[3] that are formed by evenly dividing one cycle of the clock signal clk_b into four phases (four phases shifted by 90°) and that are phase-shifted by a quarter of the cycle. The phase shift circuit 9 includes the four delay circuits 90A to 90D that are configured as FF chains. The phase shift circuit 9 reads, into the four delay circuits 90A to 90D, one bit at a time of the 4-bit serial bit strings SOA to SOD, respectively, that are output in a mutually parallel manner from the four shift registers 80A to 80D, respectively, of the shift register circuit 8. That is, in the four delay circuits 90A to 90D configured as FF chains, the first-stage FF reads the first bit of the bit strings SOA to SOD, respectively, output from the shift register circuit 8; and the FFs from the second stage onward read the bit stored in the corresponding previous FF. For example, in the delay circuit 90A, a first-stage FF 91A constituting an FF chain reads the first bit of the bit string SOA in synchronization with the clock signal clk_b[0]. At the same time, a second-stage FF 92A reads, from the previous FF 91A, the bit stored in the FF 91A in synchronization with the clock signal clk_b[0]; and a third-stage FF 93A reads, from the previous FF 92A, the bit stored in the FF 92A in synchronization with the clock signal clk_b[0].

The delay circuit 90A includes three delay FFs 91A to 93A that are connected in series and are clock-synchronized with the same clock signal clk_b[0]. The delay circuit 90B includes four delay FFs 91B to 94B that are connected in series and are clock-synchronized with the different clock signals elk b[0], clk_b[3], clk_b[2], and clk_b[1], respectively. The delay circuit 90C includes four delay FFs 91C to 94C that are connected in series. Herein, the delay FF 910C is clock-synchronized with the clock signal clk_b [0], while the delay FF 92C is clock-synchronized with the clock signal clk_b[3]. Moreover, the delay FFs 930 and 94C are clock-synchronized with the clock signal clk_b[2]. The delay circuit 90D includes four delay FFs 91D to 94D. The delay FF 91D is clock-synchronized with the clock signal clk_b[0], while the delay FFs 92D, 93D, and 94D are clock-synchronized with the clock signal clk_b[3].

Regarding the delay circuits 90A to 90D configured as tour FF chains in the phase shift circuit 9, the synchronization FFs 93A, 94B, 94C, and 94D that are positioned at the last stage perform a serial bit output operation explained below. That is, the 4-bit serial bit strings SOA to SOD that are input according to four parallel operations are eventually subjected to phase-by-phase serial output in sequence corresponding to the four phase clocks clk_b[0], clk_b[1], clk_b[2], and clk_b[3]. As a result, the serial output signal (ser_out) 152, which is the final output signal of the serialization circuit 6, is output from the phase shift circuit 9 to the output terminal of the serialization circuit 6. That is, from the perspective of the output side of the serial output signal (ser_out) 152, the flow of operations in which the serial bit string output as SOA is output as the serial output signal (ser_out) 152 via the delay circuit 90A corresponds to the phase timing of the clock signal clk_b[0]. Similarly, from the perspective of the output side of the serial output signal (ser_out) 152, the flows of operations in which the serial bit strings output as SOB to SOD are output as the serial output signal (ser_out) 152 via the delay circuits 90B to 90D, respectively, correspond to the phase timings of the clock signals clk_b[1] to clk_b[3], respectively.

In order to perform phase-by-phase serial output in sequence of the four serial bit strings, which are output from the shift registers 80A to 80D, corresponding to the four phase clocks clk_b[0], clk_b[1], clk_b[2], and clk_b[3]; the following redundant configuration is implemented in the phase shift circuit 9. That is, regarding the delay circuits 90A to 90D having a four-parallel configuration in the phase shift circuit 9, instead of having a configuration in which single FFs are provided with phase clocks of mutually different phases from among the four phases, a redundant configuration is implemented in which the portion at the previous stage of the last-stage FF in the delay circuits 90A to 90D has one or more redundant FFs disposed in series. As a result, among the delay circuits 90A to 90D having a four-parallel configuration, a timing margin equal to three-fourth of the clock signal clk_b (equal to three phases) can be provided in between the clock timings for operating the FFs of the delay circuits 90A to 90D. For example, even if the four serial bits, which are input to the four delay circuits 90A to 90D from the shift registers 80A to 80D, respectively, having a four-parallel configuration in the shift register circuit 8, have the pulse width equal to two cycles (eight pulses); because of the clock timing margin provided using the FF redundant configuration in the delay circuits 90A to 90D, it becomes possible to reliably perform a normal serialization operation for each of the four phases (clk_b[0] to clk_b[3]).

Regarding the shift register circuit 8 and the phase shift circuit 9 illustrated in FIG. 3, the reason for having the internal configuration described above is to ensure that the communication of bit data among the FFs in the circuit is accurately and reliably performed in the manner described below when the entire circuit including the self-test circuit 10 is driven at the highest clock speed. In the following explanation, SO[0], SO[1], SO[2], and SO[3] represent serial output bit strings that are output by the four delay circuits 90A to 90D, respectively, illustrated in FIG. 3. Moreover, the four serial output bit strings are collectively referred to as SO[3:0]. During the normal operations, when the entire circuit is being driven with the clock signal of a quarter of the cycle of clk_b corresponding to the highest clock speed, the serial bit strings SOA to SOD are output in the state described below from the shift registers 80A to 80D, respectively, to the phase shift circuit 9. That is same as the state in which each of the bit strings SOA to SOD is output not in synchronization with one corresponding phase from among the four phases of clk_b[3:0] but in synchronization with all four phases of clk_b[3:0].

Meanwhile, during a logical test of the entire circuit, the bit strings SOA to SOD are output to the phase shift circuit 9 in synchronization with the clock signal clk_b[0]. As a result, during a logical test of the entire circuit, particularly when the bit strings SOB and SOD are output to the phase shift circuit 9 in synchronization with the clock signals clk_b[1] and clk_b[3], respectively; Q_CLK input to the FFs has the pulse interval equal to a quarter of the cycle of clk_b, that is, equal to 0.25×1 cycle of clk_b. In that regard, in the first embodiment, in each of the four delay circuits 90A to 90D in the phase shift circuit 9, a plurality of redundant FFs are disposed at the previous stage of the last-stage FF. As a result, in the first embodiment, timing restrictions are released by synchronizing the bit strings SOA to SOD to clk_b[3:0] in a stepwise manner, while providing a margin equal to or greater than 0.75×1 cycle of clk_b (equal to three-fourth of the cycle of clk_b, or equivalent to three phases of clk_b[3:0]) in the timing adjustment range in the synchronization design.

Meanwhile, as the circuit configuration of the portion in the subsequent stages of the delay circuits 90A to 90D in the phase shift circuit 9, instead of having a circuit configuration including the NOR circuits 61 and 62 and the NAND circuit 63, it is also possible to think of a circuit configuration as described below. That is, in a circuit configuration, the four serial bit outputs that synchronize with the four phases of clk_b[3:0] are subjected to an AND operation using an AND circuit and pulse data for a single phase is generated; and four pieces of pulse data for four phases are subjected to an OR operation using an OR circuit. However, in the phase shift circuit 9 according to the first embodiment, such a circuit configuration is not implemented. That is because of the fact that, due to the circuit configuration explained above, when the serial output signal (ser_out) 152 is generated, there is a possibility of generation of extremely short pulses. For that reason, in the phase shift circuit 9, in order to avoid extremely short pulses, a circuit configuration is implemented in which the smallest pulse width of the serial output signal (ser_out) 152, which is output by the NAND circuit 63, is set to be equal to the pulse width of four phases.

More particularly, regarding the serial bit input to each of the four input terminals of the NOR circuits 61 and 62, the pulse width becomes equal to the pulse width of a single phase that is identical to one cycle of clk_b. Hence, four times of the smallest unit, which is equal to the pulse width of a single phase, becomes the smallest pulse width of the serial output signal (ser_out) 152. Thus, for example, as in the case in which the phase clock clk_b has the clock frequency of 100 MHz, when the clock speed of the phase clock clk_b is slow, the smallest pulse width of the serial output signal (ser_out) 152 is equal to 10 nanoseconds (ns). Moreover, for example, when the phase clock clk_b has the clock frequency of 1.2 GHz, the pulse width of a single phase becomes equal to 208.3 picoseconds (ps). Hence, the smallest pulse width of the serial output signal (ser_out) 152 is equal to 1 ns that is identical to four pulse widths of a single phase.

The phase shift circuit 9 according to the first embodiment generates the pulse width of each pulse of the serial output signal (ser_out) 152 to be equal to a minimum of four phases so as to avoid extremely short pulses, and generates the serial output signal (ser_out) 152 by performing an OR operation with respect to the serial output bit strings SO[0] to SO[3]. That is, the phase shift circuit 9 generates the serial output signal (ser_out) 152 by performing an OR operation with respect to SO[3:0]. When the serial output signal (ser_out) 152 is set to have the smallest pulse width equivalent to the pulse width of four phases, pulses having the width equal to one cycle of the phase clock clk_b are generated only in the serial output bit string SO[0]. When the serial output signal (ser_out) 152 is set to have the pulse width of five to seven phases, pulses having the width equal to one cycle of the phase clock clk_b are generated in not only the serial output bit string SO[0] but in all serial output bit strings SO[0] to SO[3]. When the serial output signal (ser_out) 152 is set to have the pulse width of eight phases, the pulse width of the serial output bit string SO[0] becomes equal to two cycles of the phase clock clk_b.

In this way, in the circuit configuration including the NOR circuits 61 and 62 and the NAND circuit 63 as illustrated in FIG. 3, since each pulse of SO[3:0] overlaps over the width equal to one phase or more, the rising edge and the trailing edge of a pulse do not occur at the same timing. Meanwhile, in the explanation of the first embodiment, an example is explained in which a multiphase clock signal is made of four phases, and the phase difference between phases is 90°. However, the number of phases of a multiphase clock in a serialization circuit is not limited to four, and the phase difference between phases constituting a multiphase clock is not limited to 90°. According to the first embodiment, even in the case in which the multiphase clock has six phases and is configured with six phase clocks having phase difference of 60°; it becomes possible to enhance the timing accuracy of the serial pulse output of the serialization circuit 6. Thus, a multiphase clock can be configured from N number of phase clocks which correspond to N number of phases obtained by dividing a single cycle by N and which are phase-shifted from each other by 360°/N.

Figure 5:
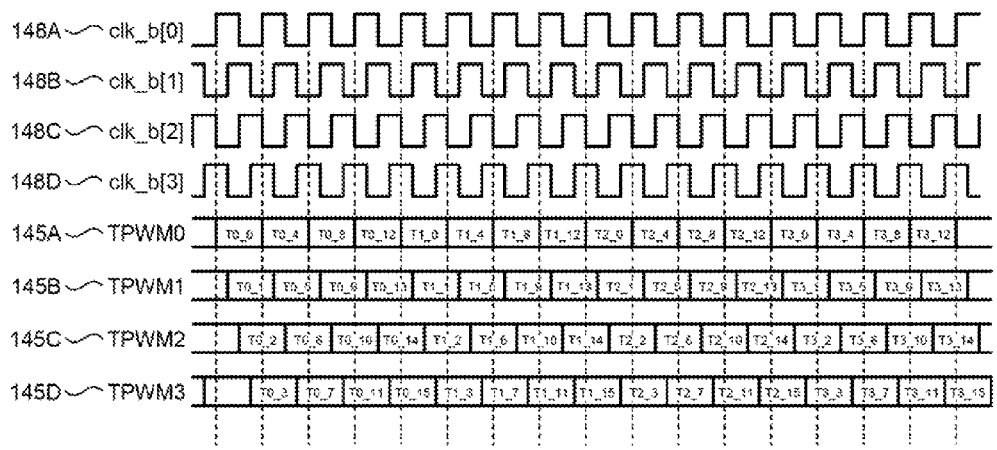
FIG. 5 is a timing chart for explaining in-circuit operation timings at the time when the serialization circuit receives test data and outputs the test data as a serial output signal.

FIG. 5 is a timing chart for explaining in-circuit operation timings at the time when the serialization circuit 6 receives the test data 120 illustrated in FIG. 3 from the data selecting circuit 1 and outputs the test data 120 as the serial output signal (ser_out) 152. In the latch circuit 7, a 16-bit wide register is embedded for storing the received test data as 16-bit wide parallel data. As a result of reading the test data 120 into the 16-bit wide register, bit values for 16 bits can be set in the sections illustrated as T0_0 to T0_15 in FIG. 5.

In FIG. 5, regarding four sections T0_0, T0_4, T0_8, and T0_12 illustrated as 145A, the corresponding bit values are the zeroth bit value, the fourth bit value, the eighth bit value, and the 12-th bit value, respectively, of the test data 120. These four bit values are read into the register of the latch circuit 7 in synchronization with the rising edge of the pulse of the phase clock clk_b[Q], and are subjected to serial conversion by the shift register 80A. In FIG. 5, regarding four sections T0_1, T0_5, T0_9, and T0_13 illustrated as 145B, the corresponding bit values are the first bit value, the fifth bit value, the ninth bit value, and the 13-th bit value, respectively, of the test data 120. These four bit values are read into the register of the latch circuit 7 in synchronization with the rising edge of the pulse of the phase clock clk_b[1], and are subjected to serial conversion by the shift register 80B.

In FIG. 5, regarding four sections T0_0, T0_4, T0_8, and T0_12 illustrated as 145C, the corresponding bit values are the second bit value, the sixth bit value, the 10-th bit value, and the 14-th bit value, respectively, of the test data 120. These four bit values are read into the register of the latch circuit 7 in synchronization with the rising edge of the pulse of the phase clock clk_b[2], and are subjected to serial conversion by the shift register 80C. In FIG. 5, regarding four sections T0_3, T0_7, T0_11, and T0_15 illustrated as 145D, the corresponding bit values are the third bit value, the seventh bit value, the 11-th bit value, and the 15-th bit value, respectively, of the test data 120. These four bit values are read into the register of the latch circuit 7 in synchronization with the rising edge of the pulse of the phase clock clk_b[3], and are subjected to serial conversion by the shift register 80D.

The serialization circuit 6 reads the 16 bits corresponding to the sections T0_0 to T0_15 as first test data 120 (DATA_TEST0); and, upon completion of the serial conversion of the first test data 120, reads the 16 bits corresponding to the sections T1_0 to T1_15 as second test data 120 and performs serial conversion. In an identical manner, the serialization circuit 6 reads the 16 bits corresponding to the sections T1_0 to T1_15 as second test data 120 (DATA_TEST1); and, upon completion of the serial conversion of the second test data 120, reads the 16 bits corresponding to the sections T2_0 to T2_15 as third test data 120 (DATA_TEST2) and performs serial conversion. In this way, the serialization circuit 6 can repeatedly perform serial conversion of a plurality of pieces of test data 120 (DATA_TEST0, DATA_TEST1, DATA_TEST2, . . . ) that are input in succession, and can repeatedly perform serial output of 16 bits at a time as the serial output signal 152. At that time, the 16 bits constituting the value of a single piece of test data 120, which is read into the 16-bit wide register, is output to the last-stage FF of the phase shift circuit 9 illustrated in FIG. 3, and is output as the serial output signal (ser_out) 152 via the NOR circuits 61 and 62 and the NAND circuit 63.

In order to ensure that the desired pulse length is output as the serial output signal (ser_out) 152 from the output terminal of the serialization circuit 6, an appropriate setting value is substituted in the 16-bit wide register in the latch circuit 7; and the testen signal 121 illustrated in FIG. 4 is set to the ON state so as to enable switching between the normal data 110 and the test data 120 as the input data (data_in[15:0]) 140 to be input to the serialization circuit 6. The input data_in in the form of 16-bit wide parallel data is repeatedly read into the latch circuit 7 in synchronization with each phase clock constituting four phase clocks from the least significant bit (LSB).

Figure 6:
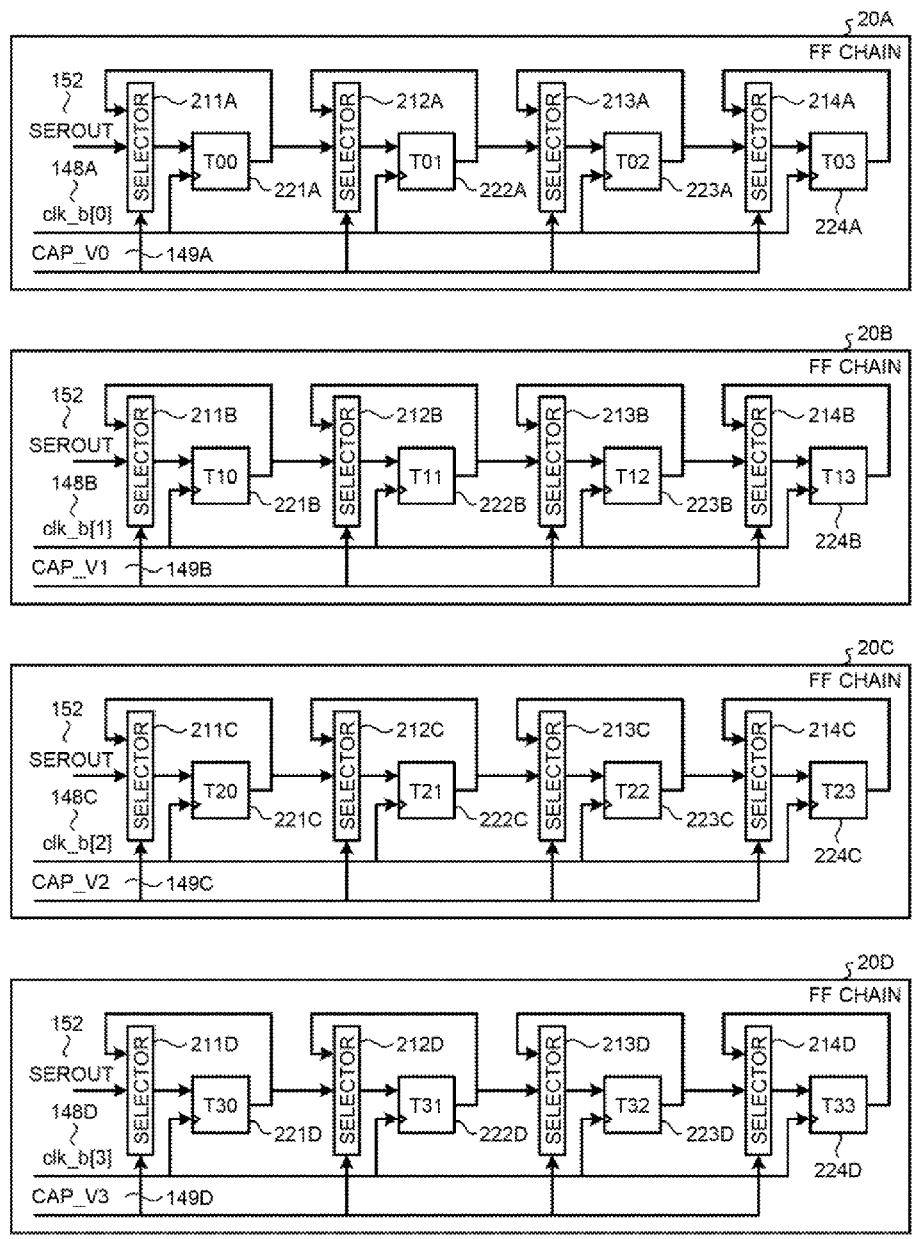
FIG. 6 is a circuit diagram illustrating four flip-flop (FF) chains for logical test that are configured in parallel in a logical test circuit.

FIG. 6 is a block diagram illustrating an internal configuration of the logical test circuit 2 illustrated in FIG. 3. The logical test circuit 2 includes four FF chains 20A, 20B, 20C, and 20D that read, in parallel, four bits at a time of the 16-bit serial bit strings that are serially output as the serial output signal (ser_out) 152 by the serialization circuit 6. Then, while holding the four serial bit strings that are read in parallel and four bits at a time from the serialization circuit 6, the FF chains 20A, 20B, 20C, and 20D perform a logical test by comparing whether the respective serial bit strings are identical to a known string of bit values.

In the FF chain 20A for logical test, in synchronization with each pulse of clk_b[0] 148A, either the bit data that is input one bit at a time from outside is input as the serial output signal (ser_out) 152 to an FF 221A or the bit value being currently stored in the FF 221A is again fed back as input. The selection of the bit data to be input to the FF 221A is done by a selector 211A. Moreover, in synchronization with each pulse of the clock signal clk_b[1] 148A, either the bit data stored in the previous-stage FF 221A is input to an FF 222A or the bit value being currently stored in the FF 221A is again fed back as input. The selection of the bit data to be input to the FF 222A is done by a selector 212A. In an identical manner, in synchronization with each pulse of the clock signal clk_b[0] 148A, either the bit data stored in the previous-stage FF 222A is input to an FF 223A or the bit value being currently stored in the FF 223A is again fed back as input. The selection of the bit data to be input to the FF 223A is done by a selector 213A. In an identical manner, in synchronization with each pulse of the clock signal clk_b[0] 148A, either the bit data stored in the previous-stage FF 223A is input to an FF 224A or the bit value being currently stored in the FF 224A is again fed back as input. The selection of the bit data to be input to the FF 224A is done by a selector 214A.

Thus, if a capture enable signal (CAP_V0) 149A that is input from outside is in the ON state, the selectors 211A, 212A, 213A, and 214A switch the input with respect to each FF in such a way that four bits of the serial output signal (ser_out) 152, which is input from outside, are read into the FF chain 20A for logical test while being shifted one bit at a time. On the other hand, if the capture enable signal (CAP_V0) 149A that is input from outside is in the OFF state, the selectors 211A, 212A, 213A, and 214A switch the input with respect to each FF in such a way that the bit value (the logical state) being currently stored in the four FFs 221A to 224A, which constitute the FF chain 20A for logical test, is held as it is.

In the FF chain 20B for logical test, in synchronization with each pulse of clk_b[1] 148B, either the bit data that is input one bit at a time from outside is input as the serial output signal (ser_out) 152 to an FF 221B or the bit value being currently stored in the FF 221B is again fed back as input. The selection of the bit data to be input to the FF 221B is done by a selector 211B. Moreover, in synchronization with each pulse of the clock signal clk_b[1] 148B, either the bit data stored in the previous-stage FF 221B is input to an FF 222B or the bit value being currently stored in the FF 222B is again fed back as input. The selection of the bit data to be input to the FF 222B is done by a selector 212B. In an identical manner, in synchronization with each pulse of the clock signal clk_b[1] 148B, either the bit data stored in the previous-stage FF 222B is input to an FF 223B or the bit value being currently stored in the FF 223B is again fed back as input. The selection of the bit data to be input to the FF 223B is done by a selector 213B. In an identical manner, in synchronization with each pulse of the clock signal clk_b[1] 148B, either the bit data stored in the previous-stage FF 223B is input to an FF 224B or the bit value being currently stored in the FF 224B is again fed back as input. The selection of the bit data to be input to the FF 224B is done by a selector 214B.

Thus, if a capture enable signal (CAP_V1) 149B that is input from outside is in the ON state, the selectors 211B, 212B, 213B, and 214B switch the input with respect to each FF in such a way that four bits of the serial output signal (ser_out) 152, which is input from outside, are read into the FF chain 20B for logical test while being shifted one bit at a time. On the other hand, if the capture enable signal (CAP_V1) 149B that is input from outside is in the OFF state, the selectors 211B, 212B, 213B, and 214B switch the input with respect to each FF in such a way that the bit value (the logical state) being currently stored in the four FFs 221B to 224B, which constitute the FF chain 20B for logical test, is held as it is.

In the FF chain 20C for logical test, in synchronization with each pulse of clk_b[2] 148C, either the bit data that is input one bit at a time from outside is input as the serial output signal (ser_out) 152 to an FF 221C or the bit value being currently stored in the FF 221C is again fed back as input. The selection of the bit data to be input to the FF 221C is done by a selector 211C. Moreover, in synchronization with each pulse of the clock signal clk_b[2] 148C, either the bit data stored in the previous-stage FF 221C is input to an FF 222C or the bit value being currently stored in the FF 222C is again fed back as input. The selection of the bit data to be input to the FF 222C is done by a selector 212C. In an identical manner, in synchronization with each pulse of the clock signal clk_b[2] 148C, either the bit data stored in the previous-stage FF 222C is input to an FF 223C or the bit value being currently stored in the FF 223C is again fed back as input. The selection of the bit data to be input to the FF 223C is done by a selector 213C. In an identical manner, in synchronization with each pulse of the clock signal clk_b[2] 148C, either the bit data stored in the previous-stage FF 223C is input to an FF 224C or the bit value being currently stored in the FF 224C is again fed back as input. The selection of the bit data to be input to the FF 224C is done by a selector 214C.

Thus, if a capture enable signal (CAP_V2) 149C that is input from outside is in the ON state, the selectors 211C, 212C, 213C, and 214C switch the input with respect to each FF in such a way that four bits of the serial output signal (ser_out) 152, which is input from outside, are read into the FF chain 20C for logical test while being shifted one bit at a time. On the other hand, if the capture enable signal (CAP_V2) 149C that is input from outside is in the OFF state, the selectors 211C, 212C, 213C, and 214C switch the input with respect to each FF in such a way that the bit value (the logical state) being currently stored in the four FFs 221C to 224C, which constitute the FF chain 20C for logical test, is held as it is.

In the FF chain 20D for logical test, in synchronization with each pulse of clk_b[3] 148D, either the bit data that is input one bit at a time from outside is input as the serial output signal (ser_out) 152 to an FF 221D or the bit value being currently stored in the FF 221D is again fed back as input. The selection of the bit data to be input to the FF 221D is done by a selector 211D. Moreover, in synchronization with each pulse of the clock signal clk_b[3] 148D, either the bit data stored in the previous-stage FF 221D is input to an FF 222D or the bit value being currently stored in the FF 222D is again fed back as input. The selection of the bit data to be input to the FF 222D is done by a selector 212D. In an identical manner, in synchronization with each pulse of the clock signal clk_b[3] 148D, either the bit data stored in the previous-stage FF 222D is input to an FF 223D or the bit value being currently stored in the FF 223D is again fed back as input. The selection of the bit data to be input to the FF 223D is done by a selector 213I. In an identical manner, in synchronization with each pulse of the clock signal clk_b[3] 148D, either the bit data stored in the previous-stage FF 223D is input to an FF 224D or the bit value being currently stored in the FF 224D is again fed back as input. The selection of the bit data to be input to the FF 2241 is done by a selector 214D.

Thus, if a capture enable signal (CAP_V3) 149D that is input from outside is in the ON state, the selectors 211D, 212D, 213D, and 214D switch the input with respect to each FF in such a way that four bits of the serial output signal (ser_out) 152, which is input from outside, are read into the FF chain 20D for logical test while being shifted one bit at a time. On the other hand, if the capture enable signal (CAP_V3) 149D that is input from outside is in the OFF state, the selectors 211D, 212D, 213D, and 214D switch the input with respect to each FF in such a way that the bit value (the logical state) being currently stored in the four FFs 221D to 224D, which constitute the FF chain 20D for logical test, is held as it is.

When the CPU 11 illustrated in FIG. 2 sets the testen signal 121 to the ON state and switches the input data (data_in[15:0]), which is to be input to the serialization circuit 6, to the test data 120; the logical test circuit 2 performs a logical test according to the following sequence. Firstly, the logical test circuit 2 starts an operation of reading, one bit at a time, the serial output signal 152 illustrated in FIG. 2 as a SEROUT signal into an internal buffer (not illustrated). Then, as soon as the capture enable signal 149A (CAP_V0 illustrated in FIG. 6) is switched from the OFF state to the ON state; the FF chain 20A for logical test reads, while sampling, one bit at a time of the SEROUT signal in synchronization with the phase clock clk_b[0] (148A illustrated in FIG. 6).

In a concurrent and parallel manner to that, as soon as the capture enable signal 149B (CAP_V1 illustrated in FIG. 6) is switched from the OFF state to the ON state; the FF chain 20B for logical test reads, while sampling, one bit at a time of the SEROUT signal in synchronization with the phase clock clk_b[1] (148B illustrated in FIG. 6). In a concurrent and parallel manner to that, as soon as the capture enable signal 149C (CAP_V2 illustrated in FIG. 6) is switched from the OFF state to the ON state; the FF chain 20C for logical test reads, while sampling, one bit at a time of the SEROUT signal in synchronization with the phase clock clk_b[2] (148C illustrated in FIG. 6). In a concurrent and parallel manner to that, as soon as the capture enable signal 149D (CAP_V3 illustrated in FIG. 6) is switched from the OFF state to the ON state; the FF chain 200 for logical test reads, while sampling, one bit at a time of the SEROUT signal in synchronization with the phase clock clk_b[3] (148D illustrated in FIG. 6).

Meanwhile, the four serial output bit strings SO[0] to SO[3] that are output from the four delay circuits 90A to 90D, respectively, are output in synchronization with the four phase clocks clk_b[0] to clk_b[3], respectively. Accordingly, when the four FFs 221A to 224A in the FF chain 20A for logical test read the SEROUT signal equivalent to four bits in synchronization with the phase clock clk_b[0], the portion equivalent to four bits included in the serial output bit string SO[0] is read into the FF chain 20A for logical test. In an identical manner, when the four FFs 221B to 224B in the FF chain 20B for logical test read the SEROUT signal equivalent to four bits in synchronization with the phase clock clk_b[1], the portion equivalent to four bits included in the serial output bit string SO[1] is read into the FF chain 20B for logical test. In an identical manner, when the four FFs 221C to 224C in the FF chain 20C for logical test read the SEROUT signal equivalent to four bits in synchronization with the phase clock clk_b[2], the portion equivalent to four bits included in the serial output bit string SO[2] is read into the FF chain 20C for logical test. When the four FFs 221D to 224D in the FF chain 20D for logical test read the SEROUT signal equivalent to four bits in synchronization with the phase clock clk_b[3], the portion equivalent to four bits included in the serial output bit string SO[3] is read into the FF chain 20D for logical test.

After the four FFs 221A to 224A in the FF chain 20A for logical test finish reading the SEROUT signal equivalent to four bits in synchronization with the phase clock clk_b[0], the FF chain 20A for logical test stops the operation of sampling and reading the SEROUT signal. The reading operation is stopped as soon as the capture enable signal 149A (CAP_V0 illustrated in FIG. 6), which is output to the four FFs 221A to 224A in the FF chain 20A for logical test, is switched from the ON state to the OFF state. In an identical manner, after the four FFs 221B to 224B in the FF chain 20B for logical test finish reading the SEROUT signal equivalent to four bits in synchronization with the phase clock clk_b[1], the FF chain 20B for logical test stops the operation of sampling and reading the SEROUT signal. The reading operation is stopped as soon as the capture enable signal 149B (CAP_V1 illustrated in FIG. 6), which is output to the four FFs 221B to 224B in the FF chain 20B for logical test, is switched from the ON state to the OFF state.

In an identical manner, after the four FFs 221C to 224C in the FF chain 20C for logical test finish reading the SEROUT signal equivalent to four bits in synchronization with the phase clock clk_b[2], the FF chain 20C for logical test stops the operation of sampling and reading the SEROUT signal. The reading operation is stopped as soon as the capture enable signal 149C (CAP_V2 illustrated in FIG. 6), which is output to the four FFs 221C to 224C in the FF chain 20C for logical test, is switched from the ON state to the OFF state. In an identical manner, after the four FFs 221D to 224D in the FF chain 20D for logical test finish reading the SEROUT signal equivalent to four bits in synchronization with the phase clock clk_b[3], the FF chain 20D for logical test stops the operation of sampling and reading the SEROUT signal. The reading operation is stopped as soon as the capture enable signal 1490 (CAP_V3 illustrated in FIG. 6), which is output to the four FFs 221D to 224D in the FF chain 20D for logical test, is switched from the ON state to the OFF state.

Subsequently, the four pieces of serial bit string data (TO) equivalent to four bits and held by the four FF chains 20A to 200 for logical test are read as 16-bit data by means of a register access, and the 16-bit data is used as the correct value of the test data 120 representing 16-bit wide parallel data for comparison with a known bit pattern. Of the 16-bit data that is read, if one or more bit values are different than the corresponding bit values in the known bit pattern, it is understood that some FFs in the circuit are defective or malfunctioning. For example, consider a case in which, of the four-parallel 4-bit data corresponding to the serial output bit strings SO[0] to SO[3], the 4-bit data corresponding to the serial output bit string SO[0] that is output in synchronization with the phase clock clk_b[0] contains different bit values than the known bit pattern. In that case, it can be determined that, in the sequence of signal paths synchronized with the phase clock clk_b[0] corresponding to the serial output bit string SO[0] in the serialization circuit 6, one or more FFs are defective or malfunctioning.

Meanwhile, it is preferable that the logical test is repeatedly performed while variously changing the bit pattern of the test data 120 regarding the four FF chains 20A to 20D corresponding to the control signals CAP_V0 to CAP_V3, respectively, illustrated in FIG. 6 (the capture enable signals 149A to 149D, respectively, illustrated in FIG. 6). As the candidates for the bit pattern, it is possible to think of 0101, 1010, 1000, 0100, 0010, and 0001. For example, bit strings T00 to T03 that are read into the FF chain 20A for logical test are read via a sequence of signal paths synchronized with the phase clock clk_b[0]corresponding to the serial output bit string SO[0] in the serialization circuit 6. Thus, if the bit pattern "0101" is set as the zeroth bit value, the fourth bit value, the eighth bit value, and the 12-th bit value of the test data (DATA_TEST*) 120, a recurrent pattern of "01" is constantly held in the bit strings T00 to T03. For that reason, when the data held in the FF chain 20A for logical test is read therefrom, if the read bit string does not have the bit pattern of "0101", it is understood that either one of the following two cases have occurred: one or more FFs present in the sequence of signal paths synchronized with the phase clock clk_b[0] corresponding to the serial output bit string SO[0] in the serialization circuit 6 have not been output with the bit pattern of "0101", or one or more FFs in the FF chain 20A for logical test have not been output with the pattern of "0101".

Figure 7:
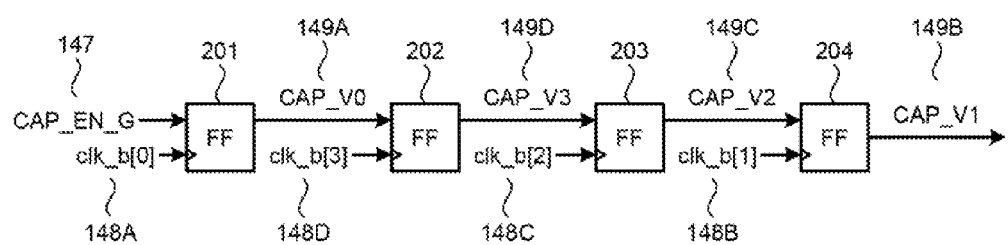
FIG. 7 is a diagram illustrating a circuit structure of a capture enable signal generating unit disposed in the logical test circuit.

In the logical test circuit 2 illustrated in FIG. 2, the four control signals CAP_V0 to CAP_V3 illustrated in FIG. 6 (the capture enable signals 149A to 149D illustrated in FIG. 6) are generated by a capture enable signal generating unit. A circuit configuration of the capture enable signal generating unit is illustrated in FIG. 7. As illustrated in FIG. 7, the circuit configuration of the capture enable signal generating unit is made of four stages of FFs 201, 202, 203, and 204 connected in series. When the CPU 11 illustrated in FIG. 2 writes data (132 in FIG. 2) in the control bits of a control register (not illustrated), a CAP_EN signal 147 that is output to the logical test circuit 2 is switched to the ON state and a CAP_EN_G signal 147 output to the FF 201 is also switched to the ON state. As a result, the FF 201 outputs the CAP_V0 signal (the capture enable signal 149A illustrated in FIG. 6) to the next-stage FF 202 in synchronization with the phase clock clk_b[0], as well as outputs the CAP_V0 signal to the FF chain 20A for logical test.

Then, the FF 202 that receives the CAP_V0 signal (the capture enable signal 149A illustrated in FIG. 6) outputs the CAP_V3 signal (the capture enable signal 149D illustrated in FIG. 6) to the next-stage FF 203 in synchronization with the phase clock clk_b[3], as well as outputs the CAP_V3 signal to the FF chain 20D for logical test. Subsequently, the FF 203 that receives the CAP_V3 signal (the capture enable signal 149D illustrated in FIG. 6) outputs the CAP_V2 signal (the capture enable signal 149C illustrated in FIG. 6) to the next-stage FF 204 in synchronization with the phase clock clk_b[2], as well as outputs the CAP_V2 signal to the FF chain 20C for logical test. Lastly, the FF 204 that receives the CAP_V2 signal (the capture enable signal 149C illustrated in FIG. 6) outputs the CAP_V1 signal (the capture enable signal 149B illustrated in FIG. 6) in synchronization with the phase clock clk_b[1], as well as outputs the CAP_V1 signal to the FF chain 20B for logical test.

Figure 8:
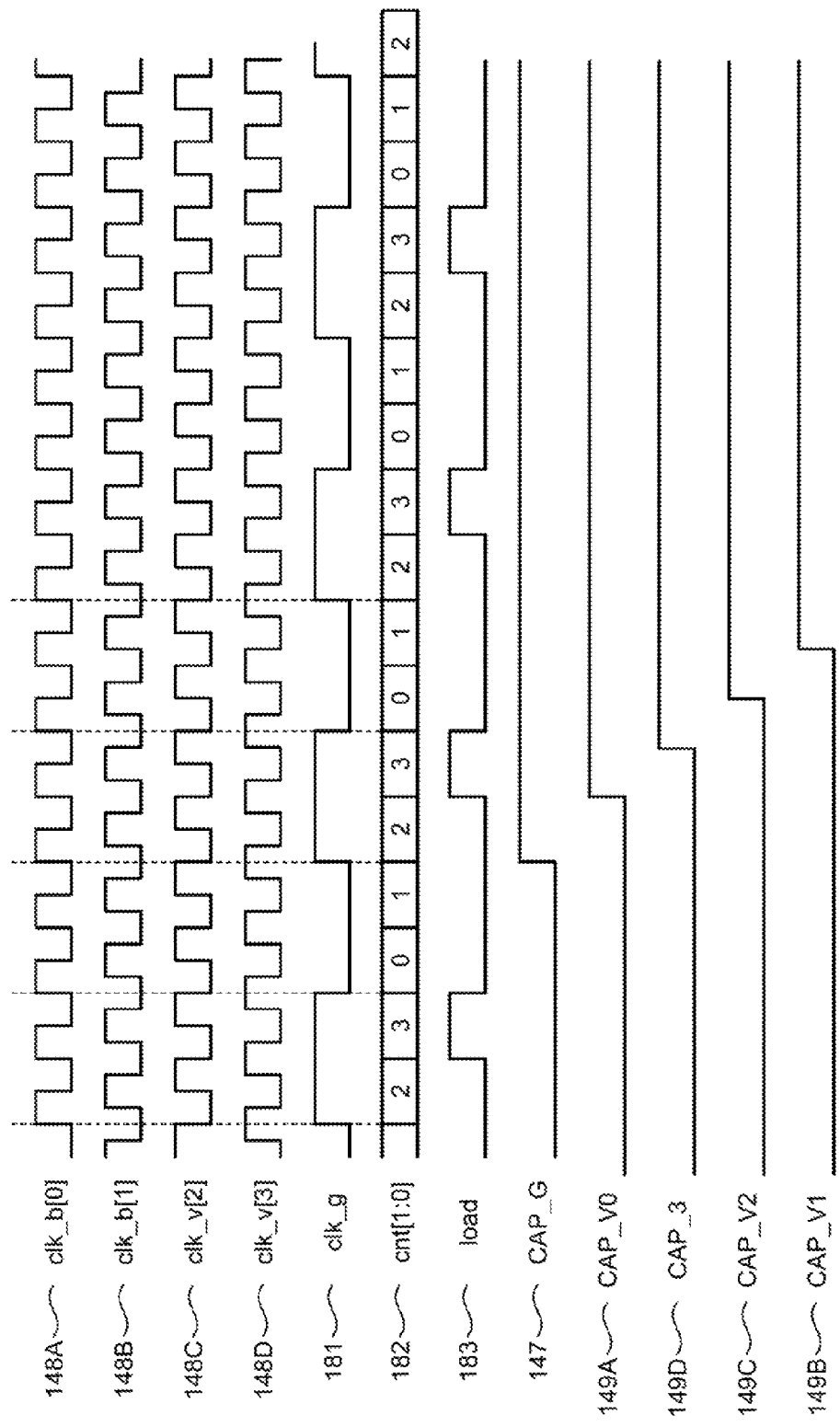
FIG. 8 is a timing chart for explaining the relationship of capture enable signals and other clock signal.

As described above, the capture enable signal generating unit illustrated in FIG. 7 generates the four control signals CAP_V0 to CAP_V3 illustrated in FIG. 6 (the capture enable signals 149A to 149D illustrated in FIG. 6) by performing timing shifting with respect to the CAP_EN_G signal 147 using the clock signals shifted by three phases identical to three-fourth of the phase clock clk_b for each stage of the four stages of the FFs 201 to 204. The capture enable signal generating unit illustrated in FIG. 7 outputs the four control signals CAP_V0 to CAP_V3 (the capture enable signals 149A to 149D illustrated in FIG. 6) to the four FF chains 20A to 20D for logical test, respectively. FIG. 8 is a timing chart for explaining the relationship of the control signals CAP_V0 to CAP_V3 (the capture enable signals 149A to 149D illustrated in FIG. 6) and the CAP_EN_G signal 147 with other clock signals.

As described above, according to the first embodiment, as a result of switching the operation mode of the target circuit for testing from the normal operation mode to the scan mode as is done in the conventional technology, the trace monitoring operation of the logical state ("0" or "1") of the FFs in the circuit is not switched between ON and OFF states. Rather, in the first embodiment, the logical test circuit 2 is installed inside the target circuit for testing, and the logical test circuit 2 includes, separate from the existing FF chains in the target circuit for testing, the FF chains 20A to 20D for logical test for the purpose of performing a test in the state in which bit string data is read and held. The logical test circuit 2 is configured in such a way that the start and the termination of an operation of reading the serialization circuit output of the target circuit for testing into the FF chains 20A to 20O for logical test is switched according to switching the control signals CAP_V0 to (CAP_V3 (the capture enable signals 149A to 149D) between ON and OFF states. Then, in the logical test circuit 2, once all bits constituting the parallel data are read into the FF chains 20A to 20D for logical test, all of the read bits are compared with a known bit pattern.

In the logical test circuit 2 according to the first embodiment, the FF chains 20A to 200 for logical test have a four-parallel configuration corresponding to the four phase clocks constituting clk_b[3:0]. Moreover, each of the FF chains 20A to 20D for logical test having a four-parallel configuration reads the output of the serialization circuit 6 while shifting data one bit at a time in synchronization with the clock signal of the phase. At that time, the control signals CAP_V0 to CAP_V3 (the capture enable signals 149A to 149D), which switch the bit reading operation of the four FF chains 20A to 200 for logical test having a parallel configuration between ON and OFF states, are phase-shifted by a quarter of the cycle of the phase clock clk_b among the four FF chains 20A to 20D for logical test corresponding to the four phases.

With reference to FIG. 4, the control signal CAP_V0 (the capture enable signal 149A) changes from the OFF state to the ON state in synchronization with the rising edge of the pulse of the phase clock clk_b[0] 148A. The control signal CAP_V3 (the capture enable signal 149D) changes from the OFF state to the ON state in synchronization with the rising edge of the pulse of the phase clock clk_b[3] 148D. The control signal CAP_V2 (the capture enable signal 149C) changes from the OFF state to the ON state in synchronization with the rising edge of the pulse of the phase clock clk_b[2] 148C. The control signal CAP_V1 (the capture enable signal 149B) changes from the OFF state to the ON state in synchronization with the rising edge of the pulse of the phase clock clk_bell 148B. The CAP_EN_G signal 147 changes from the OFF state to the ON state in synchronization with the rising edge of the pulse of a clock signal 181

(clk_g illustrated in FIG. 8). With reference to FIG. 8, a load signal 183 represents a pulse signal that, in concert with the change of the CAP_V0 to CAP_V3 signals 149A to 149D to the ON state, is used to achieve synchronization of the start timing of the operation of reading the SEROUT signal into the FF chains 20A to 20D for logical test. Moreover, a cnt[1:0] signal 182 represents a pulse signal corresponding to a 2-bit wide counter that counts the number of bits read into the FF chains 20A to 20D for logical test.

In the first embodiment, the circuit configuration of the self-test circuit 10 and the configuration of the clock control operation are as described above. As a result, in the first embodiment, it becomes possible for the phase shift circuit 9 to perform phase-by-phase serial output of the four bits, which are input from the four-parallel shift registers 80A to 80D in the shift register circuit 8, corresponding to the four phase clocks (clk_b[0] 148A to clk_b[3] 148D, respectively). At that time, in the first embodiment, even if the entire circuit is driven at the highest clock speed corresponding to the clock frequency of a quarter of the phase clock clk_b, it becomes possible to provide a sufficiently large margin the timing adjustment of the synchronization design of the entire self-test circuit.

More particularly, firstly, the shift registers 80A to 80D in the shift register circuit 8, the delay circuits 90A to 90D in the phase shift circuit 9, and the FF chains 20A to 20D for logical test in the logical test circuit 2 are configured as FF chains having four-parallel configuration and are subjected to four parallel operations. Moreover, the FF chains of the delay circuits 90A to 90D having four-parallel configuration are set to have a redundant configuration so as to provide, among the delay circuits 90A to 90D, a sufficiently large margin (equal to three-quarters of the phase clock clk_b) among the clock timings for operating the FFs. Furthermore, in tune with the fact that a sufficiently large margin (equal to three-quarters of the phase clock clk_b) among the clock timings for operating the FFs is provided among the delay circuits 90A to 90D, the four capture enable signals 149A to 149D (CAP_V0 to CAP_V3 signals) are timing-shifted in the following manner. That is, in the logical test circuit 2, the four capture enable signals 149A to 149D, which are output to the four FF chains 20A to 20D for logical test, respectively, corresponding to the four phases, are mutually phase-shifted by three-quarters of the phase clock clk_b. Herein, the CAP_V0 to CAP_V3 signals (the capture enable signals 149A to 149D) represent enable signals for switching the bit reading operation of the four FF chains 20A to 20D for logical test, respectively, between ON and OFF states. With such a circuit configuration of the self-test circuit 10 according to the first embodiment, even if the entire circuit is driven at the highest clock speed corresponding to the clock frequency of a quarter of the phase clock clk_b, it becomes possible to provide a sufficiently large margin the timing adjustment of the synchronization design of the entire circuit. Besides, in the self-test circuit 10, without having to switch the operation mode from the normal operation mode to the scan mode, it becomes possible to perform a defect detection test using the logical tracing of each flip-flop in the target circuit device for testing.

Figure 9:
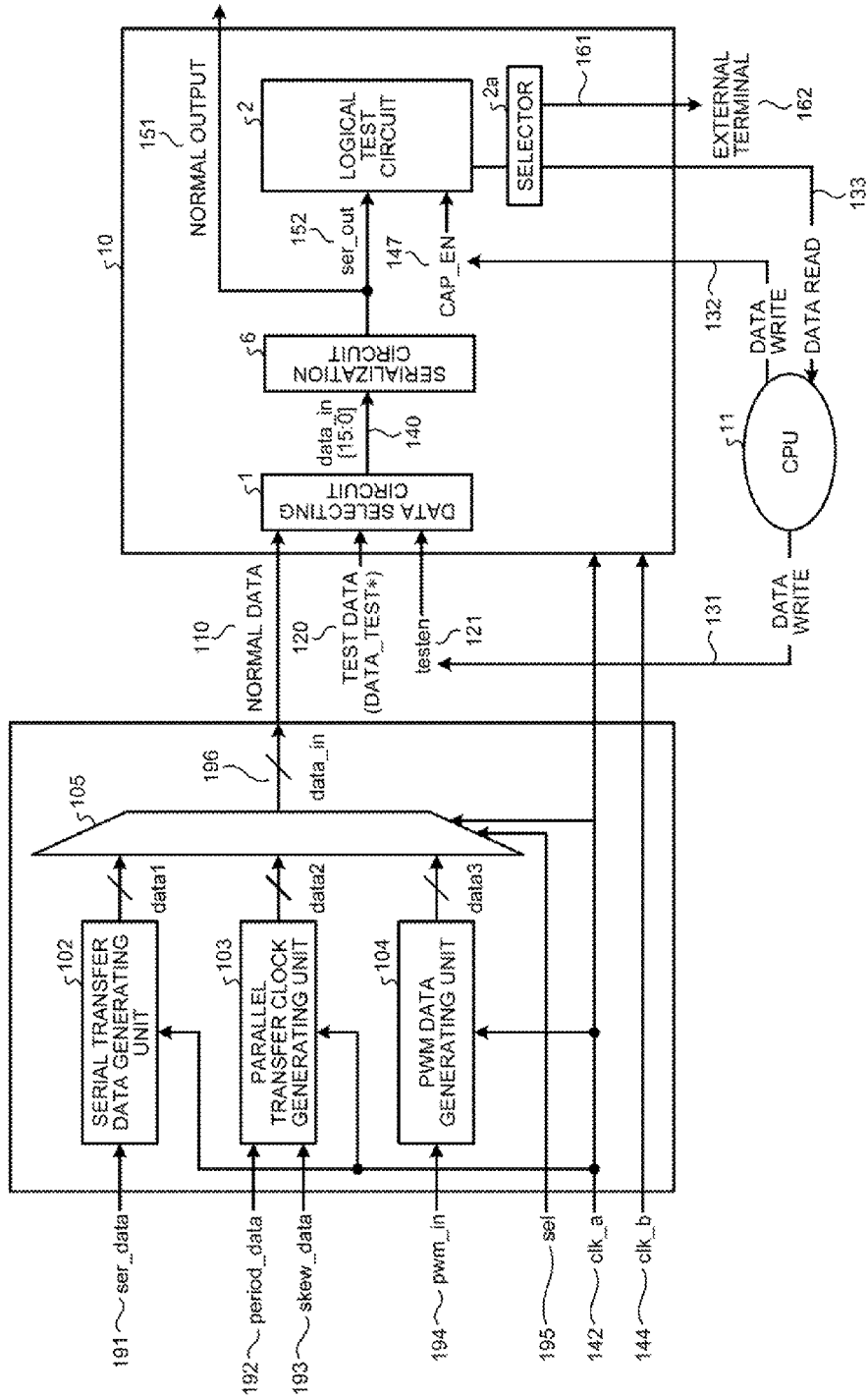
FIG. 9 is a block diagram illustrating an overall circuit configuration of a data processing circuit that is configured by replacing the serialization circuit illustrated in FIG. 1 with the self-test circuit according to the embodiment.

In FIG. 9 is illustrated an overall circuit configuration of a data processing circuit 101 that is configured by replacing the serialization circuit 106 illustrated in FIG. 1 with the self-test circuit 10 according to the first embodiment. With reference to FIG. 1, from among the pieces of 16-bit wide parallel data data1, data2, and data3 that are generated by the serial transfer data generating unit 102, the parallel transfer clock generating unit 103, and the PWM data generating unit 104, respectively; one piece of data is selected by the selector 105 and is output as output parallel data (data_in [15:0]) 196 to the self-test circuit 10. Herein, the self-test circuit 10 receives the output parallel data (data_in[15:0]) 196 either as the normal data 110 or as the test data (DATA_TEST*) 120, and treats the received data as the input data with respect to the serialization circuit 6. In the self-test circuit 10, the serialization circuit 6 that receives the test data 120 performs serial conversion with respect to the test data 120, and outputs the result as the serial output signal SEROUT to the logical test circuit 2. Upon receiving the serial output signal SEROUT; the logical test circuit 2 performs, in synchronization with the phase clock clk_b, a logical test, in which the 16-bit wide bit pattern of the test data 120 is used as the reference, according to an instruction from the CPU 11 (the data write signal 132 illustrated in FIG. 9).

Whether the self-test circuit 10 receives the parallel data 196, which is output by the selector 105, as the normal data 110 or the test data 120 can be changed using the testen signal 121 that is input to the data selecting circuit 1. The CPU 11 outputs the data write signal 131 to the control bit in the control register (not illustrated), and switches the testen signal 121 that is input to the data selecting circuit 1 from the OFF state to the ON state.

The PWM data generating unit 104 performs pulse width modulation with respect to predetermined carrier wave pulse signals according to the duty setting input signal pwm_in 194 of the PWM data, and outputs the post-pulse-width-modulation parallel data data3 to the selector 105. The self-test circuit 10 receives input of the parallel data data3 from the PWM data generating unit 104 via the selector 105. When the parallel data data3 is received as the normal data 110, the self-test circuit 10 converts the parallel data data3 into a serial signal at the highest clock speed corresponding to a quarter of the phase clock clk_b. As a result, in an optical writing device related to electrophotographic image formation, optical sensors can be mounted before and after the image area in the main scanning direction, and PWM data can be generated at the highest clock speed for correcting the variation in the main scanning direction magnification, which is attributed to a rise in temperature, according to the duration of light detection by the optical sensors.

Thus, the parallel data data3 that is converted into a serial signal by the serialization circuit 6 in the self-test circuit 10 represents a bit string in the parallel data format generated to have the desired duty ratio by the PWM data generating unit 104. Accordingly, the pulse string that is obtained as a result of serial conversion of the parallel data data3 performed by the serialization circuit 6 in the self-test circuit 10 represents a pulse string having the desired duty ratio set by the PWM data generating unit 104. Then, the self-test circuit 10 outputs that pulse string as a serial output signal 151 to the outside for pulse width modulation. Moreover, if the self-test circuit 10 is configured to receive parallel data of a known bit pattern as the test data 120 and perform the self-test using the logical test circuit 2, then it becomes possible to perform the self-test at the highest clock speed in the entire data processing circuit 101 including the self-test circuit 10.

Effect of First Embodiment

Firstly, according to the first embodiment, in the self-test circuit 10, it is possible to perform a defect detection test by performing logical tracing of each FF in the target circuit device for testing without having to switch the operation mode from the normal operation mode to the scan mode as is the case in Japanese Unexamined Patent Application Publication No. 2004-325124. Secondly, according to the first embodiment, in the self-test circuit 10, it is possible to perform a defect detection test by performing logical tracing of each FF in the target circuit device for testing without having to lower the clock operation speed from the highest clock speed, and while maintaining a high defect detection rate. Thirdly, according to the first embodiment, as a result of providing a sufficiently large margin the timing adjustment of the synchronization design of the entire self-test circuit 10, it becomes possible to ensure an accurate and reliable clock control operation of the entire self-test circuit 10.

Second Embodiment

Figure 10:
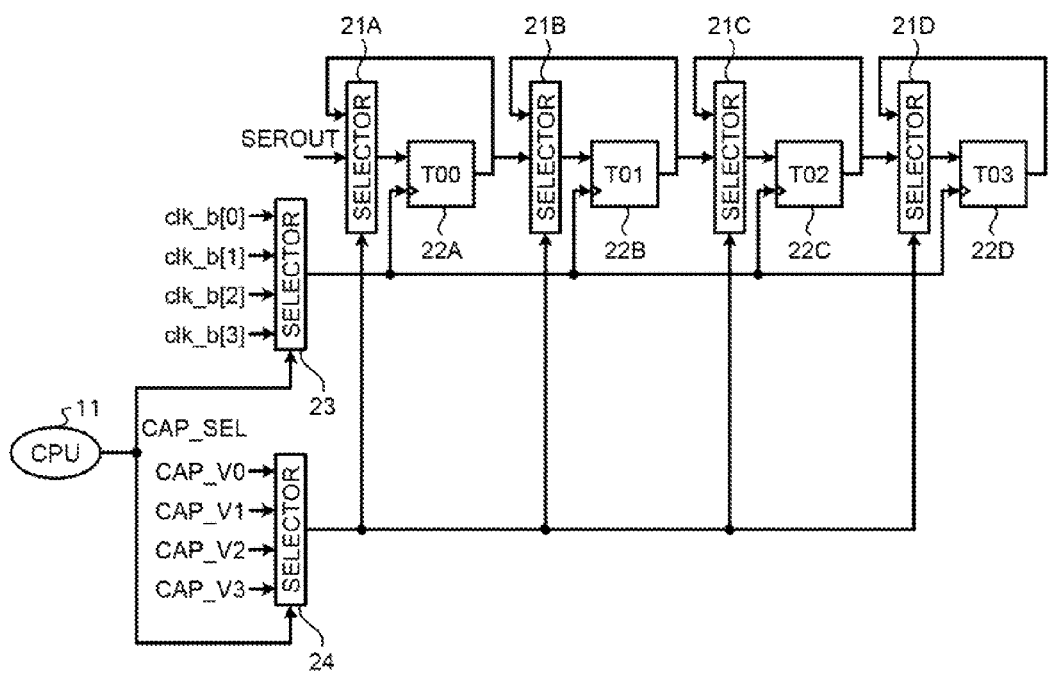
FIG. 10 is a diagram illustrating a first modification example in which the logical test circuit has a more compact circuit scale.

In FIG. 10 is illustrated a first modification example as a second embodiment in which the logical test circuit 2 has a more compact circuit scale. In the second embodiment, a selector 23 is disposed for selecting one of the CAP_V0 to CAP_V3 signals (the capture enable signals 149A to 149D). Moreover, in the second embodiment, a selector 24 is disposed for selecting one of the four phase clocks clk_b[0] to clk_b[3] as the clock signal with which a FF chain for logical test should synchronize. As a result, in the second embodiment, the four FF chains for logical test can be commoditized to a single FF chain for logical test. The CPU 11 illustrated in FIG. 9 outputs a CAP_SEL signal, which represents a selection signal, to the selector 23 and makes the selector 23 to select one of the CAP_V0 to CAP_V3 signals (the captured enable signals 149A to 149D), and outputs the selected signal to the FF chain for logical test. Moreover, the CPU 11 illustrated in FIG. 9 outputs a selection signal to the selector 24 and makes the selector 24 to select, from among the four phase clocks clk_b[0] to clk_b[3], the clock signal with which the FF chain for logical test should synchronize.

The FF chain for logical test has a four-stage configuration in which four FFs 22A, 22B, 22C, and 22D are connected in series. In the second embodiment, selectors 21A, 21B, 21C, and 21D are used to switch between reading a bit string and holding a bit value. That point is identical to the use of the selectors 811 to 814, which are explained earlier with reference to FIG. 4, in the FF chains 20A to 20D for logical test, respectively, according to the first embodiment. In this way, according to the second embodiment, it becomes possible to minimize the circuit configuration of the logical test circuit 2.

Third Embodiment

Figure 11:
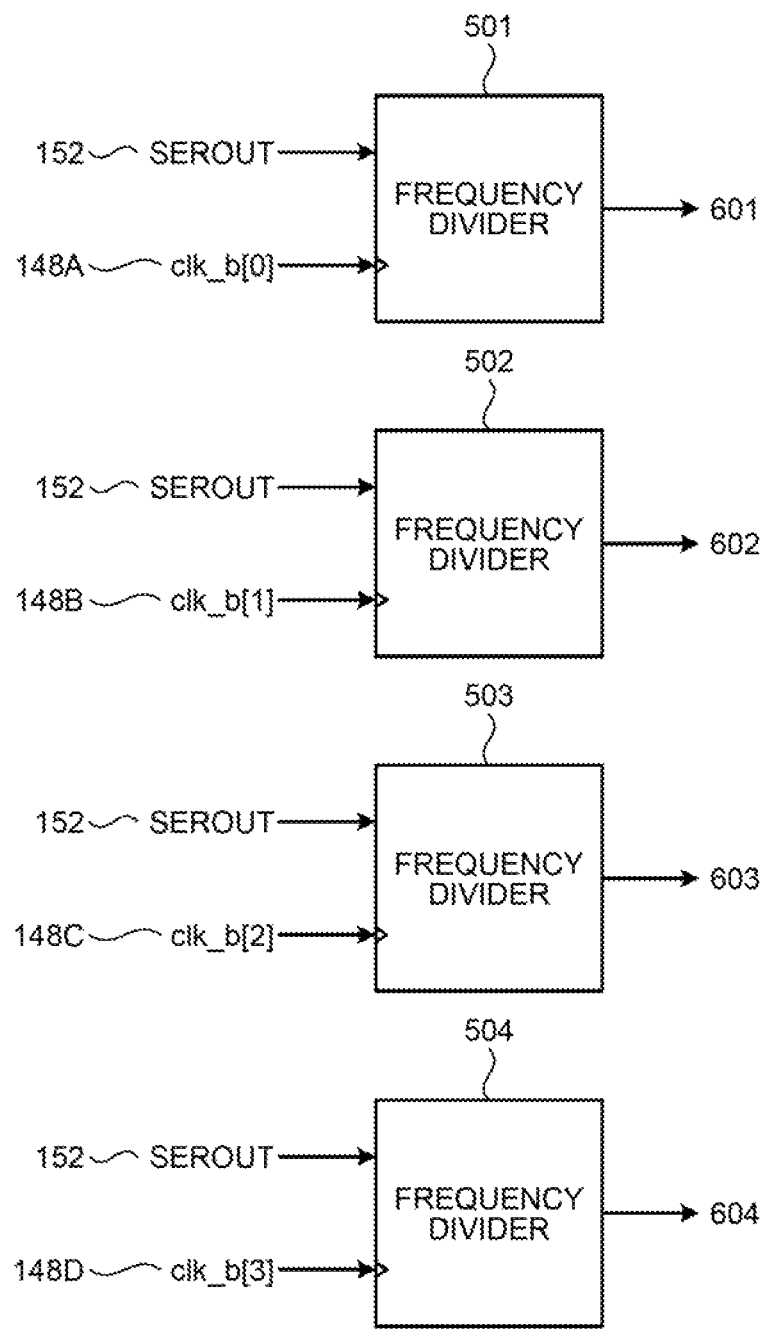
FIG. 11 is a diagram illustrating a second modification example in which a SEROUT signal that is to be input to the logical test circuit is output via a frequency divider.

In FIG. 11 is illustrated a second modification example as a third embodiment in which the SEROUT signal that is to be input to the logical test circuit 2 is output via a frequency divider. In the third embodiment, the serial output signals (ser_out[15:0]) output by the serialization circuit 6 are first input to four frequency dividers 501 to 504, which have a four-parallel configuration, and are then output to the FF chains 20A to 20D for logical test (FIG. 6) in the logical test circuit 2 (601 to 604 illustrated in FIG. 11). At that time, the frequency divider 501 operates in synchronization with the phase clock clk_b[0], the frequency divider 502 operates in synchronization with the phase clock clk_b[1], the frequency divider 503 operates in synchronization with the phase clock clk_b[2], and the frequency divider 504 operates in synchronization with the phase clock clk_b[3]. As a result, the serial output signal output by the serialization circuit 6 in the self-test circuit 10 is frequency-divided by the four frequency dividers 501 to 504 in synchronization with the four phase clock signals clk_b[0] to clk_b[3], and the result is output to the FF chains 20A to 20D for logical test having an N-parallel configuration in the logical test circuit 2. As a result, according to the third embodiment, not only the output of the FFs included in the delay circuits of the phase shift circuit 9 illustrated in FIG. 3 can be detected but also the defects in the NOR circuits 61 and 62 and the NAND circuit 63 can be detected by checking the frequency-divided signals.

Other Generalized Embodiments

In this way, the configuration and the operations of the self-test circuit 10 according to the embodiments are described above. In the explanation given above, the premise is that the data processing circuit as illustrated in FIG. 9 is configured as an integrated circuit in which a circuit portion for providing PWM data as 16-bit wide data and the self-test circuit 10 are integrated. That is done to ensure that, in an optical writing device such as an MFP, PWM data is generated at the highest clock speed for the purpose of correcting the variation in the main scanning magnification, which is attributed to a rise in temperature, according to the duration of light detection by the optical sensors that are mounted before and after the image area in the main scanning direction. However, the target to which the operating principle and the circuit structure used in the self-test circuit 10 according to the embodiments can be applied is not limited to a semiconductor integrated circuit that generates PWM data for the purpose of correcting the variation in the main scanning direction magnification in an optical writing device such as an MFP. Rather, the operating principle and the circuit structure used in the self-test circuit 10 according to the embodiments can be applied to any semiconductor integrated circuit in which the self-test function needs to be implemented. Moreover, the operating principle and the circuit structure used in the self-test circuit 10 according to the embodiments can also be used in other arbitrary application usages. Examples of the other arbitrary application usages include a circuit simulator for simulating a semiconductor circuit equipped with the self-test function and a field programmable gate array (FPGA) in which the self-test function is programmable.

In the first to third embodiments described above, the multiphase clock represents clock signals of four phases. Moreover, in the first to third embodiments described above, the parallel data that is input as the normal data 110 or the test data 120 is 16-bit wide parallel data. However, if N represents an arbitrary natural number other than four, then the multiphase clock used in driving the self-test circuit 10 according to the first to third embodiments corresponds to N number of phases formed by dividing a single cycle by N and can be configured with N number of phase clocks that are mutually phase-shifted by 360°/N. Moreover, if M represents a natural number other than 16, in the first to third embodiments, the parallel data that is input as the normal data 110 or the test data 120 to the self-test circuit 10 can be set as M-bit wide parallel data. In that case, the shift register in the shift register circuit 8, the delay circuit 90 in the phase shift circuit 9, and the FF chains 20 for logical test in the logical test circuit 2 can have an N-parallel configuration instead of a four-parallel configuration. Then, every time the shift register, the delay circuit 90, and the FF chains 20 for logical test that operate corresponding to the N number of phase clocks perform a logical test of M-bit wide parallel data, they are configured to read serial bit strings having the bit count equal to M/N.

According an aspect of the present invention, it becomes possible to obtain a self-test circuit that is capable of detecting the defects in each FF in an integrated circuit having the self-test function without having to switch the integrated circuit to a test operation mode, without having to lower the clock speed for driving the integrated circuit from the highest speed, and while maintaining a high defect detection rate.

The above-described embodiments are illustrative and do not limit the present invention. Thus, numerous additional modifications and variations are possible in light of the above teachings. For example, at least one element of different illustrative and exemplary embodiments herein may be combined with each other or substituted for each other within the scope of this disclosure and appended claims. Further, features of components of the embodiments, such as the number, the position, and the shape are not limited the embodiments and thus may be preferably set. It is therefore to be understood that within the scope of the appended claims, the disclosure of the present invention may be practiced otherwise than as specifically described herein.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), digital signal processor (DSP), field programmable gate array (FPGA) and conventional circuit components arranged to perform the recited functions.

What is claimed is:

1. A self-test circuit in an integrated circuit driven by a multiphase clock signal which includes N number of clock signals in same cycle having phases from a first phase to an N-th phase that are each phase-shifted by 1/N of the cycle, the self-test circuit comprising:
   a data selecting circuit configured to switch input data between normal data and test data for logical test, the input data being input as M-bit wide parallel data to the self-test circuit;
   a serialization circuit configured to perform serial conversion of the input data in N-parallel manner and outputs bits in N-parallel manner, as a single serial output signal at timing corresponding to each phase from the first phase to the N-th phase; and
   a logical test circuit configured to, in synchronization with timing corresponding to each phase from the first phase to the N-th phase, import the serial output signal as N-parallel bit strings each having length equal to M/N number of bits and perform a bit logical test for M number of bits.

2. The self-test circuit in the integrated circuit according to claim 1, wherein
   the serialization circuit includes a phase shift circuit configured to
   input N number of bit strings that are Output as a result of the N-parallel serial conversion, to N number of delay circuits made of a series circuit of a plurality of flip-flops (FFs), and
   output, as the single serial output signal, bits that are output in the N-parallel manner from last-stage FF of the N number of delay circuits,
   the logical test circuit includes FF chains for logical test having N-parallel configuration separately from the N number of delays circuits, and
   the FF chains for logical test having N-parallel configuration are configured to be able to switch between starting and stopping an operation of importing, one bit at a time, the serial output signal as N-parallel bit strings each having length equal to M/N number of bits according to ON/OFF status of N number of capture signals.

3. The self-test circuit in the integrated circuit according to claim 2, wherein
   each of the N number of delay circuits performs delayed output of each bit by a redundant delay amount smaller than a single cycle via a different number of FF stages according to each phase from the first phase to the N-th phase,
   with N number of capture signals that are mutually phase-shifted by the redundant delay amount serving as a trigger, the FF chains for logical test having N-parallel configuration start operation of importing the serial output signal as N-parallel bit strings, and
   when the self-test circuit is driven at clock speed of 1/N cycle, the redundant delay amount is determined according to synchronization design timing adjustment range required for correctly sending and receiving data among circuit elements.

4. The self-test circuit in the integrated circuit according to claim 3, wherein
   the N number of delay circuits correspond to the first phase to the N-th phase of the multiphase clock, and
   last-stage FF in each of the delay circuits outputs, in synchronization with corresponding phase of the multiphase clock, bits stored therein.

5. The self-test circuit in the integrated circuit according to claim 1, wherein
   the serialization circuit further includes shift registers configured to have N-parallel configuration for outputting N number of bit strings by performing the N-parallel serial conversion, and
   each of the shift registers having N-parallel configuration includes a shift FF chain that reads the input data one bit at a time in synchronization with timing of the first phase.

6. A data processing circuit comprising:
   the self-test circuit according to claim 1; and
   a parallel data generating unit configured to, based on pulse width modulation data input from outside, generate parallel data to be used in setting a duty ratio of pulse strings output as the serial output signal, wherein
   a pulse string that is formed when the serialization circuit in the self-test circuit converts the parallel data into a serial signal has the duty ratio that is set.

7. The self-test circuit in the integrated circuit according to claim 1, wherein
   the logical test circuit includes a single FF chain for logical test separately from the N number of delay circuits,
   the self-test circuit comprises a first selector circuit configured to select one of N number of clock signals respectively corresponding to the phases from the first phase to the N-th phase, and output the selected clock signal to the single FF chain for logical test,
   the self-test circuit comprises a second selector circuit configured to select one of N number of capture signals respectively corresponding to the phases from the first phase to the N-th phase, and output the selected capture signal to the single FF chain for logical test, and the single FF chain for logical test is configured to switch between starting and stopping an operation of importing, one bit at a time, the serial output signal as a single bit string having length equal to M number of bits in synchronization with the clock signal selected by the first selector circuit, and switching between the starting and the stopping is done according to ON/OFF status of the capture signal selected by the second selector circuit.

8. The self-test circuit in the integrated circuit according to claim 2, further comprising N number of frequency dividers configured to operate in synchronization with N number of clock signals corresponding to phases from the first phase to the N-th phases, wherein a serial output signal output by the serialization circuit in the self-test circuit is frequency-divided by the N number of frequency dividers in synchronization with the N number of clock signals, and is output to the FF chains for logical test having N-parallel configuration in the logical test circuit.

* * * * *